(12) United States Patent
Lee et al.

(10) Patent No.: US 11,437,443 B2
(45) Date of Patent: Sep. 6, 2022

(54) DISPLAY DEVICE

(71) Applicant: LG DISPLAY CO., LTD., Seoul (KR)

(72) Inventors: Yangsik Lee, Seoul (KR); Jungho Jo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 4 days.

(21) Appl. No.: 17/060,659

(22) Filed: Oct. 1, 2020

(65) Prior Publication Data

US 2021/0151513 A1 May 20, 2021

(30) Foreign Application Priority Data

Nov. 14, 2019 (KR) ........................ 10-2019-0146090

(51) Int. Cl.
*G09G 5/00* (2006.01)
*H01L 27/32* (2006.01)
*G06F 3/041* (2006.01)
*G06F 3/044* (2006.01)

(52) U.S. Cl.
CPC .......... *H01L 27/323* (2013.01); *G06F 3/0412* (2013.01); *G06F 3/0443* (2019.05); *G06F 3/0446* (2019.05); *G06F 3/04164* (2019.05); *H01L 27/3276* (2013.01); *G06F 2203/04111* (2013.01)

(58) Field of Classification Search
CPC ......... G06F 2203/04111; G06F 3/0412; G06F 3/04164; G06F 3/0443; G06F 3/0446; H01L 27/323; H01L 27/3276; H01L 51/5253

USPC ................................................ 345/170–178
See application file for complete search history.

(56) References Cited

U.S. PATENT DOCUMENTS

| | | | |
|---|---|---|---|
| 10,340,317 B2 * | 7/2019 | Oh | H01L 27/323 |
| 2015/0070312 A1 * | 3/2015 | Her | G06F 3/0446 345/174 |
| 2018/0033834 A1 * | 2/2018 | Jun | G06F 3/0443 |
| 2018/0061899 A1 * | 3/2018 | Oh | H01L 51/5253 |
| 2019/0369787 A1 * | 12/2019 | Park | G06F 3/0446 |
| 2021/0026477 A1 * | 1/2021 | Lee | G09G 3/20 |
| 2021/0026478 A1 * | 1/2021 | Lee | G06F 3/04164 |
| 2021/0026513 A1 * | 1/2021 | Lee | G06F 3/04164 |
| 2021/0064185 A1 * | 3/2021 | Guo | G06F 3/0443 |
| 2021/0066401 A1 * | 3/2021 | Won | G06F 3/0412 |
| 2021/0072865 A1 * | 3/2021 | He | G06F 3/0446 |
| 2021/0089154 A1 * | 3/2021 | Wang | G02F 1/13338 |

(Continued)

*Primary Examiner* — Jennifer T Nguyen

(74) *Attorney, Agent, or Firm* — Morgan, Lewis & Bockius LLP

(57) ABSTRACT

A display device includes a substrate having an active area and a non-active area where the non-active area includes a first and second routing areas; a transistor over the active area; a device insulating layer over the transistor; a pixel electrode over the device insulating layer and electrically connected to a source or drain electrode of the transistor via a contact hole in the device insulating layer; an emitting layer over the pixel electrode; a common electrode over the emitting layer; an encapsulation layer over the common electrode in the active area and the first routing area, and having an inclined surface in the first routing area; one or more dams at a boundary between the first and second routing areas and having a height higher than those of surroundings; and a side edge touch electrode in at least one of the first and second routing areas.

26 Claims, 24 Drawing Sheets

(56) References Cited

U.S. PATENT DOCUMENTS

| | | | |
|---|---|---|---|
| 2021/0089171 A1* | 3/2021 | Zhang | H01L 51/0097 |
| 2021/0097256 A1* | 4/2021 | Weng | G06F 21/32 |
| 2021/0117029 A1* | 4/2021 | Kang | G09G 3/20 |
| 2021/0124448 A1* | 4/2021 | Lee | G06F 3/0445 |
| 2021/0124461 A1* | 4/2021 | Tominaga | G06F 3/04164 |
| 2021/0141491 A1* | 5/2021 | Gogte | G06F 3/0412 |
| 2021/0151513 A1* | 5/2021 | Lee | H01L 27/323 |
| 2021/0181886 A1* | 6/2021 | Hua | G06F 3/0416 |
| 2021/0184171 A1* | 6/2021 | Ohara | H05B 33/12 |
| 2021/0200355 A1* | 7/2021 | Park | G06F 3/0445 |
| 2021/0200360 A1* | 7/2021 | Lee | H01L 27/3234 |
| 2021/0215962 A1* | 7/2021 | Xiong | G06F 3/041 |
| 2021/0216169 A1* | 7/2021 | Chen | G06F 3/0446 |
| 2021/0223883 A1* | 7/2021 | Xu | H01L 27/016 |
| 2021/0225216 A1* | 7/2021 | Wang | G09G 3/006 |
| 2021/0226175 A1* | 7/2021 | Cao | H01L 51/56 |

* cited by examiner

DISPLAY DEVICE

CROSS REFERENCE TO RELATED APPLICATION

This application claims priority from Korean Patent Application No. 10-2019-0146090, filed on Nov. 14, 2019, which is hereby incorporated by reference for all purposes as if fully set forth herein.

BACKGROUND

Technical Field

Embodiments relate to a display device.

Discussion of the Related Art

Along with the development of information society, demand for various types of image display devices is increasing. In this regard, a range of display devices, such as liquid crystal display (LCD) devices, plasma display devices, and organic light-emitting diode (OLED) displays, have recently come into widespread use.

Such a display device (in particular, a mobile device, such as a smartphone or a tablet computer) is commonly provided with physical hardware buttons respectively having a specific function (e.g. volume control or power on/off) in the bezel at the periphery of a screen on which images are displayed. The presence of such physical hardware buttons may inevitably increase the size of the display device and the number of components and lead to difficulties in fabrication.

SUMMARY

Accordingly, embodiments of the present disclosure are directed to a display device that substantially obviates one or more of the problems due to limitations and disadvantages of the related art.

Various aspects provide a display device having a structure able to overcome limitations in design caused by a physical hardware button, thereby enabling better and more creative designs and reductions in the size and the number of components required therein.

Also provided is a display device able to realize the functions of physical hardware buttons without being provided with such buttons.

Also provided is a display device able to realize a touch sensing soft button(s) in the bezel, such that all physical hardware buttons may be removed from the bezel.

Also provided is a display device having a touch sensor structure including side edge touch electrodes in a location of a display panel corresponding to the bezel in order to realize the soft button(s).

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device may comprise: a substrate including an active area on which images are displayed and a non-active area in which no images are displayed, the non-active area including a first routing area and a second routing area; a transistor located over the substrate and in the active area; a device insulating layer located over the transistor; a pixel electrode located over the device insulating layer and electrically connected to a source electrode or a drain electrode of the transistor via a contact hole in the device insulating layer; an emitting layer located over the pixel electrode; a common electrode located over the emitting layer; an encapsulation layer located over the common electrode, located in the active area and the first routing area, and having an inclined surface in the first routing area; one or more dams located at a boundary between the first routing area and the second routing area and having a height higher than those of surroundings; and a side edge touch electrode located in at least one of the first routing area, the second routing area, or a combination thereof.

The side edge touch electrode may overlap the inclined surface of the encapsulation layer.

The side edge touch electrode overlapping the inclined surface of the encapsulation layer may include a touch sensor material disposed in the active area.

The side edge touch electrode may be located more outward than the one or more dams.

The side edge touch electrode located more outward than the one or more dams may include a display electrode material or a touch sensor material (i.e. a touch sensor metal) disposed in the active area.

The display device may further include: a first insulating layer located under the side edge touch electrode; a metal layer located under the first insulating layer; a second insulating layer located under the metal layer; and a gate electrode material layer located under the second insulating layer.

The gate electrode material layer may include a gate electrode material the same as a gate electrode of the transistor.

The side edge touch electrode may include a source/drain electrode material the same as a source electrode and a drain electrode of the transistor.

The side edge touch electrode may be electrically connected to the metal layer via a contact hole in the first insulating layer.

The metal layer may be electrically connected to the gate electrode material layer via a contact hole in the second insulating layer.

The side edge touch electrode may be electrically connected to the gate electrode material layer via a double contact hole in the first insulating layer and the second insulating layer.

The display device may further include: a first insulating layer located under the side edge touch electrode; a metal layer located under the first insulating layer; a second insulating layer located under the metal layer; and a gate electrode material layer located under second insulating layer.

The gate electrode material layer may include a gate electrode material the same as a gate electrode of the transistor. The side edge touch electrode may include a pixel electrode material the same as the pixel electrode In the active area, a source/drain electrode material layer may be located over the first insulating layer. In the non-active area, a pixel electrode material layer providing the side edge touch electrode may be located over the first insulating layer.

The side edge touch electrode may be electrically connected to the metal layer via a contact hole in the first insulating layer or electrically connected to the gate electrode material layer via a double contact hole in the first insulating layer and the second insulating layer.

In a case in which the side edge touch electrode is electrically connected to the metal layer via the contact hole in the first insulating layer, the metal layer may be electrically connected to the gate electrode material layer via a contact hole in the second insulating layer.

The display device may further include: a source/drain electrode material layer located over the first insulating layer and including a source/drain electrode material the same as a source electrode and a drain electrode of the transistor; and a peripheral insulating layer located over the source/drain electrode material layer, located under the side edge touch electrode, including an insulating material the same as the device insulating layer, and located in the non-active area.

The side edge touch electrode may be electrically connected to the source/drain electrode material layer via a contact hole in the peripheral insulating layer.

The source/drain electrode material layer may be electrically connected to the metal layer via a contact hole in the first insulating layer or electrically connected to the gate electrode material layer via a double contact hole in the first insulating layer and the second insulating layer.

In a case in which the source/drain electrode material layer is electrically connected to the metal layer via the contact hole in the first insulating layer, the metal layer may be electrically connected to the gate electrode material layer via a contact hole in the second insulating layer.

The side edge touch electrode may be electrically connected to the metal layer via a double contact hole in the peripheral insulating layer and the first insulating layer or electrically connected to the gate electrode material layer via a triple contact hole in the peripheral insulating layer, the first insulating layer, and the second insulating layer.

The display device may further include: a plurality of touch sensors located over the encapsulation layer in the active area; and a plurality of touch lines connecting the plurality of touch sensors to a touch pad portion located in the non-active area.

The plurality of touch lines may be connected to or extend from the plurality of touch sensors located in the active area, extend down along the inclined surface of the encapsulation layer, extend over the one or more dams, and connected to the touch pad portion.

The side edge touch electrode may contain the same metal as the touch sensor. The side edge touch electrode may be located to overlap the inclined surface of the encapsulation layer or be located more outward than the one or more dams.

The plurality of touch sensors may include a plurality of touch electrodes and a plurality of bridges. Each of the bridges may connect two adjacent touch electrodes among the plurality of touch electrodes. The plurality of touch electrodes and the plurality of bridges are disposed in different layers, with a sensor insulating layer being sandwiched therebetween.

The side edge touch electrode may include a touch electrode metal the same as the plurality of touch electrodes or a bridge metal the same as the plurality of bridges.

The plurality of touch electrodes may include a first touch electrode extending to the first routing area of the non-active area. The side edge touch electrode may include a first side edge touch electrode intersecting a touch electrode portion of the first touch electrode extending to the first routing area.

The display device may further include a touch sensing circuit supplying a touch driving signal having a variable voltage level to the touch electrode portion of the first touch electrode extending to the first routing area and detecting a touch in accordance with a change in capacitance of the side edge touch electrode.

The touch electrode portion of the first touch electrode extending to the first routing area and the side edge touch electrode may be located in a single layer.

The touch electrode portion of the first touch electrode extending to the first routing area may include: a first touch electrode portion more adjacent to the active area than the side edge touch electrode; a second touch electrode portion located farther away from the active area than the side edge touch electrode; and a bridge, among the plurality of bridges, connecting the first touch electrode portion and the second touch electrode portion.

The touch electrode portion of the first touch electrode extending to the first routing area may extend beyond the first routing area to the second routing area.

The side edge touch electrode may further include a second side edge touch electrode intersecting the touch electrode portion of the first touch electrode extending to the second routing area.

The plurality of touch sensors may include a first touch sensor extending to the first routing area of the non-active area. A touch sensor portion of the first touch sensor extending to the first routing area may correspond to the side edge touch electrode. The touch sensor portion may include a touch electrode metal the same as the plurality of touch electrodes or a bridge metal the same as the plurality of bridges.

The display device may further include: a side edge touch line located in at least one of the first routing area, the second routing area, or a combination thereof, and electrically connected to the side edge touch electrode; and a touch sensing circuit detecting a touch in accordance with a change in capacitance of the side edge touch electrode through the side edge touch line and executing a predetermined button process in accordance with whether or not the touch is detected.

The substrate may be bent, a portion of the substrate corresponding to the active area may be directed forward, and a portion of the substrate corresponding to the second routing area may be directed to sides.

According to embodiments, the display device may have a structure able to overcome limitations in design caused by a physical hardware button, thereby enabling better and more creative designs and reductions in the size and the number of components required therein.

In addition, according to embodiments, the display device may realize the functions of physical hardware buttons without being provided with such buttons.

In addition, according to embodiments, the display device may realize touch sensing soft buttons in the bezel, such that all physical hardware buttons may be removed from the bezel.

In addition, according to embodiments, the display device may have a touch sensor structure including side edge touch electrodes in a location of a display panel corresponding to the bezel in order to realize the soft button.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
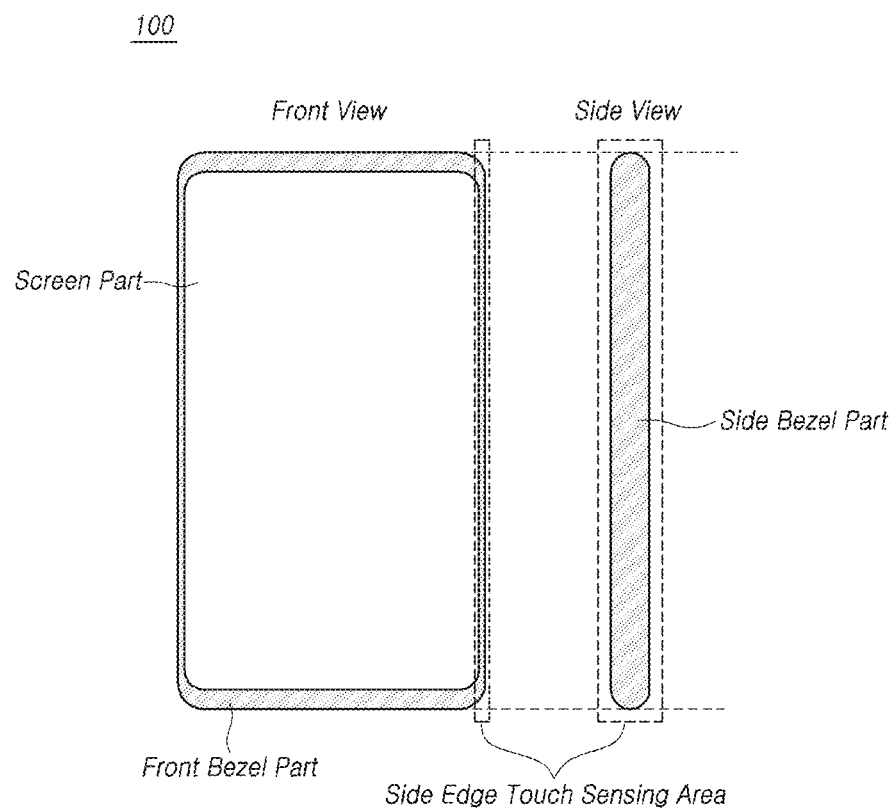
FIG. 1 illustrates a display device according to embodiments.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting", "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements, etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Figure 2A:
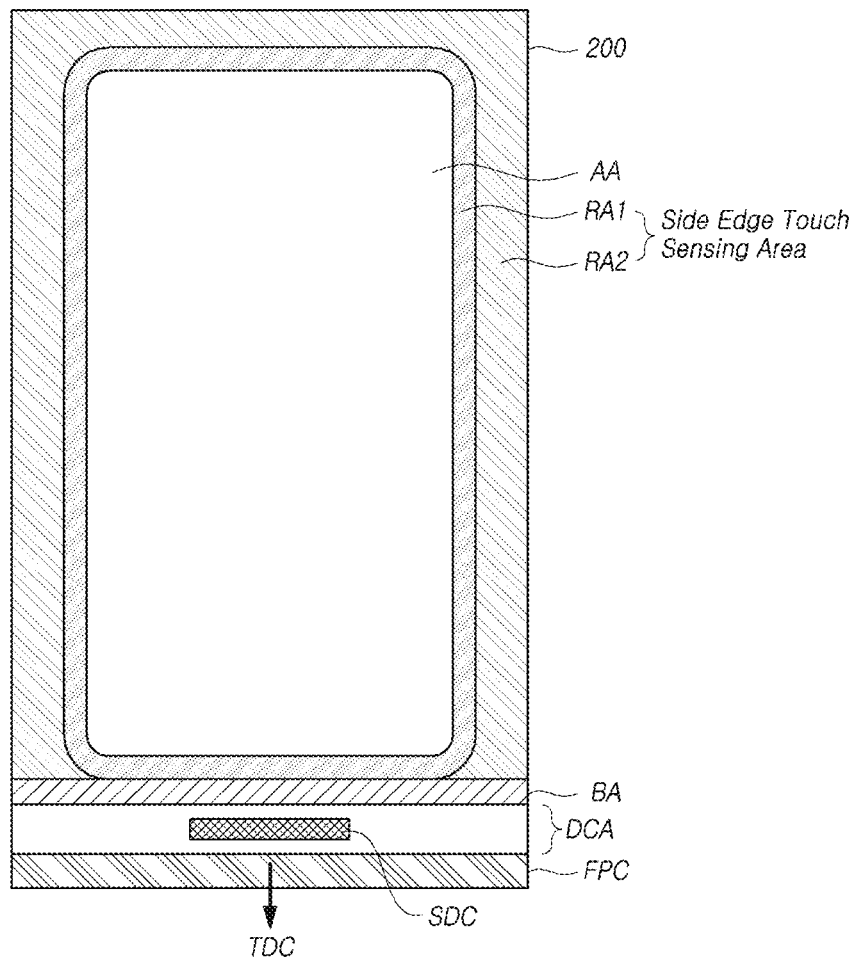
FIGS. 2A and 2B illustrate a substrate of the display device according to embodiments.
Figure 2B:
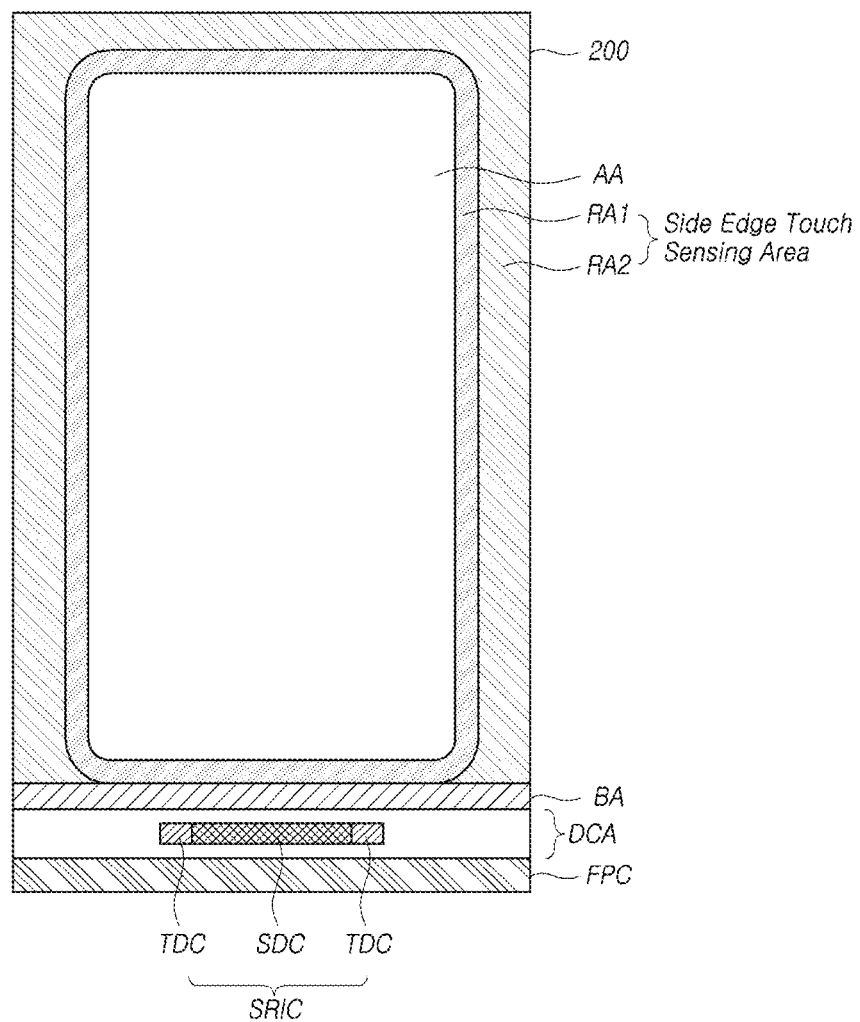
Figure 3:
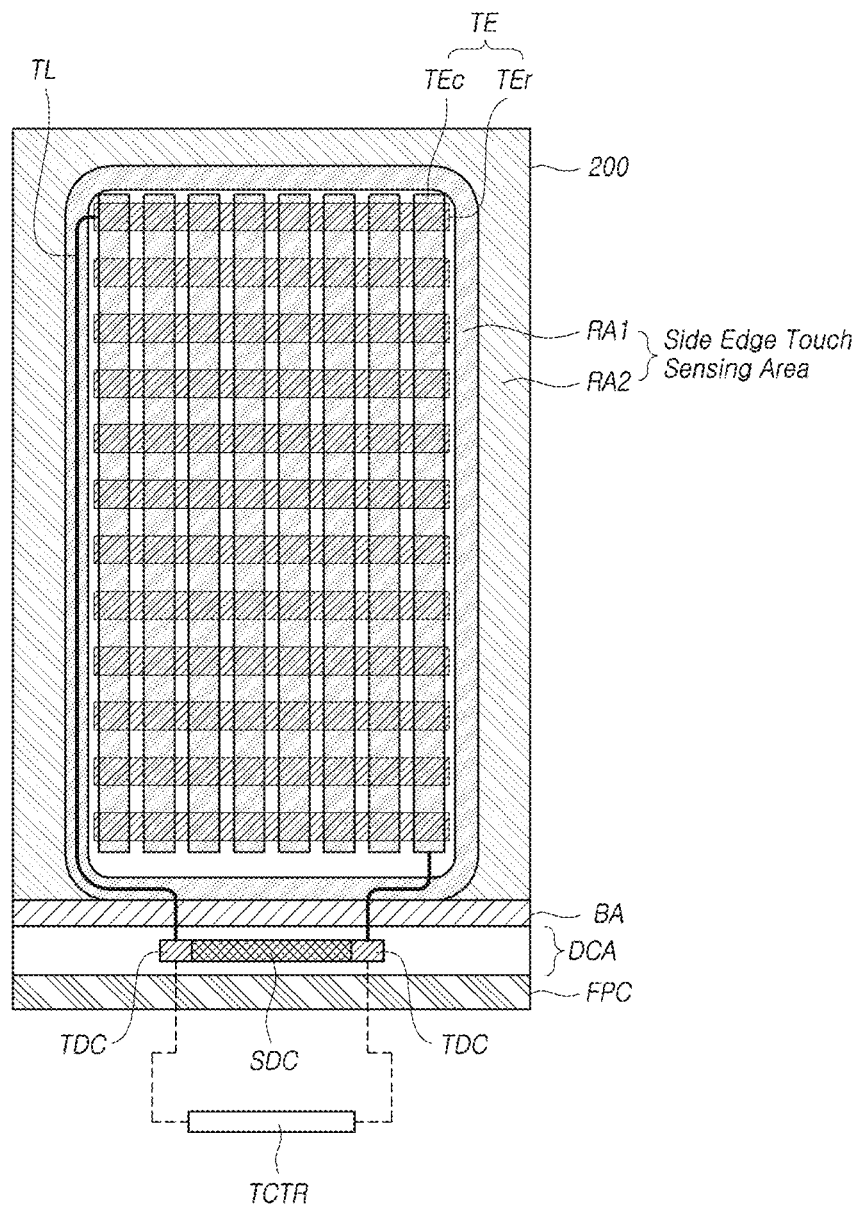
FIG. 3 illustrates a touch sensor structure of the display device according to embodiments.
Figure 4:
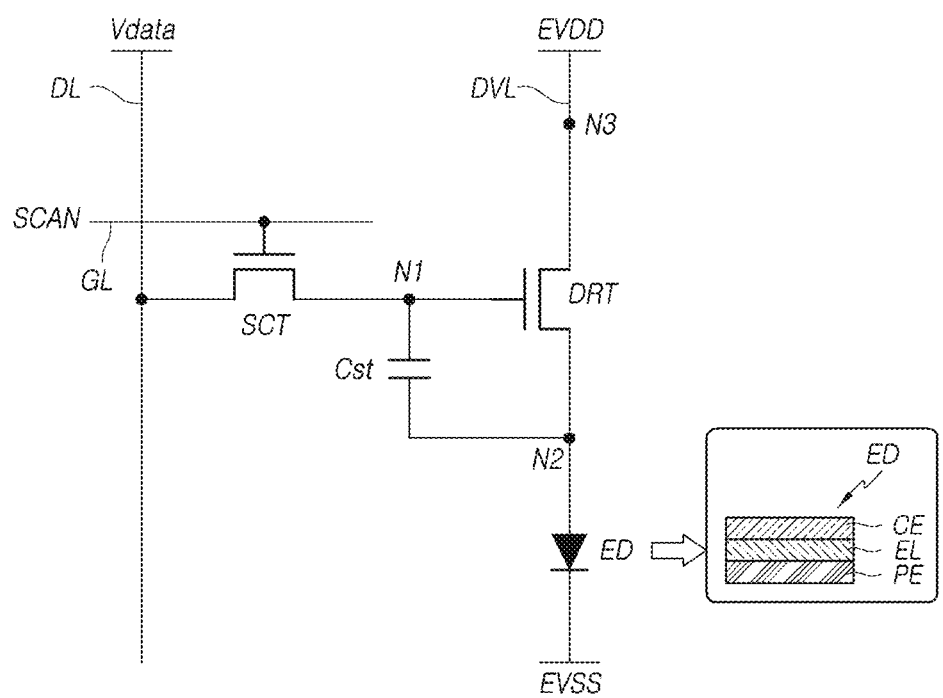
FIG. 4 illustrates an equivalent circuit of each of subpixels of the display device according to embodiments.
Figure 5:
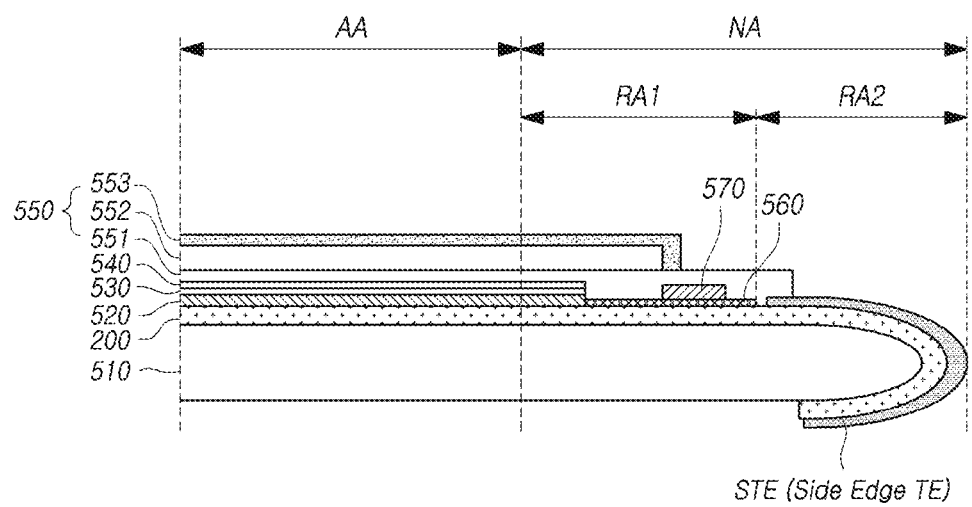
FIG. 5 is a schematic cross-sectional view of the display device according to embodiments.

FIG. 1 illustrates a display device 100 according to embodiments. FIGS. 2A and 2B illustrate a substrate 200 of the display device 100 according to embodiments. FIG. 3 illustrates a touch sensor structure of the display device 100 according to embodiments. FIG. 4 illustrates an equivalent circuit of each of the subpixels of the display device 100 according to embodiments. FIG. 5 is a schematic cross-sectional view of the display device 100 according to embodiments.

Referring to FIG. 1, the display device 100 according to embodiments may include a screen part on which an image is displayed and a bezel part at the periphery of the screen part and on which no image is displayed.

The screen part may be a part in which a display panel of the display device 100 is exposed while being an active area of the display panel. The bezel part may be a housing (or case) of the display panel while being a non-active area of the display panel.

The bezel part may include a side bezel part exposed to the sides and a front bezel part exposed to the front.

In some cases, when the display device 100 is viewed from the front, no front bezel part may be present. That is, the display device 100 according to embodiments may not include the front bezel part.

Referring to FIG. 1, the display device 100 according to embodiments does not include physical buttons typically disposed in the side bezel part. Herein, the physical buttons may be typical hardware buttons, such as a volume button (or volume buttons), a lock button (or a power button), and other function buttons, which a user may press with physical force.

Referring to FIG. 1, the display device 100 according to embodiments may be provided with no physical buttons but may include a soft button (or soft buttons) to substitute for the physical buttons.

In this regard, referring to FIG. 1, the display device 100 according to embodiments may have a touch sensor structure in at least one of the side bezel part, the front bezel part, or a combination thereof, to realize the soft button(s). The display device 100 may process a user input by detecting a touch on the bezel part using the touch sensor structure in one of the side bezel part and the front bezel part.

Referring to FIG. 1, an area of one of the side bezel part and the front bezel part of the display device 100 according to embodiments, in which touch sensing is enabled by the touch sensor structure provided therein, is referred to as a side edge touch sensing area. That is, the area in which the soft button(s) is provided in the display device 100 according to embodiments is referred to as the side edge touch sensing area.

The display device 100 according to embodiments includes, as components providing a display function: a display panel in which a plurality of data lines and a plurality of gate lines intersect each other and a plurality of subpixels are connected to the plurality of data lines and the plurality of gate lines; a gate driver circuit sequentially outputting gate signals to the plurality of gate lines; and a source driver circuit outputting image data voltages VDATA to the plurality of data lines.

The display panel may include an active area in which images are displayed and a non-active area in which no images are displayed. The plurality of subpixels for displaying images are disposed in the active area of the display panel. The display panel may include a plurality of signal lines, such as the plurality of data lines and the plurality of gate lines, in order to drive the plurality of subpixels.

In the display panel, the plurality of data lines and the plurality of gate lines may be disposed to intersect each other. For example, the plurality of data lines may be arranged in rows or columns, while the plurality of gate lines may be arranged in columns or rows. Hereinafter, for the sake of brevity, the plurality of data lines will be described as being arranged in rows, while the plurality of gate lines will be described as being arranged in columns.

A controller controls the source driver circuit and the gate driver circuit by supplying the source driver circuit and gate driver circuit with a variety of control signals (e.g. a data drive timing control signal and a gate drive timing control signal) required for driving operations thereof.

The controller starts scanning at points in time realized by respective frames, converts image data input from an external source into a data signal format readable by the source driver circuit, outputs the converted image data, and controls data driving at appropriate points in time in response to the scanning. The controller may be a timing controller used in typical display technology or be a control device including a timing controller and configured to perform other control functions. The controller may be provided as a component separate from the source driver circuit or be combined with the source driver circuit to form an integrated circuit (IC).

The source driver circuit drives the plurality of data lines by supplying the image data voltages to the plurality of data lines in response to the image data input from the controller. The source driver circuit may include one or more source driver integrated circuits (S-DICs). Each of the S-DICs may include a shift register, a latch circuit, a digital-to-analog converter (DAC), an output buffer, and the like. In some cases, each of the S-DICs may further include an analog-to-digital converter (ADC).

Each of the S-DICs may be directly connected to a bonding pad of the display panel using a tape-automated bonding (TAB) structure or a chip-on-glass (COG) structure, may be directly mounted on the display panel, or in some cases, may be provided as an integrated portion of the display panel. In addition, each of the S-DICs may be implemented using a chip-on-film (COF) structure mounted on a film connected to the display panel.

The gate driver circuit sequentially drives the plurality of gate lines by sequentially supplying a scan signal to the plurality of gate lines. Herein, the gate driver circuit may also be referred to as a "scan driver circuit".

The gate driver circuit may include a shift register, a level shifter, and the like.

The gate driver circuit may be connected to a bonding pad of the display panel using a TAB structure, a COG structure, or a chip-on-panel (COP) structure, may be implemented using a gate-in-panel (GIP) structure directly mounted on the display panel, or in some cases, may be provided as an integrated portion of the display panel. In addition, the gate driver circuit may include a plurality of gate driver integrated circuits (G-DICs) implemented using a COF structure mounted on a gate circuit film connected to the display panel.

The gate driver circuit sequentially supplies the scan signal having an on or off voltage to the plurality of gate lines, under the control of the controller.

The source driver circuit may be disposed on one side of the display panel (e.g. above or below or on the upper or lower portion of the display panel) or, in some cases, be disposed on both sides of the display panel (e.g. above and below or on the upper and lower portions of the display panel), depending on the driving method, the design of the panel, or the like. The gate driver circuit may be disposed on one side of the display panel (e.g. to the right or left or on the right or left portion of the display panel) or, in some cases, be disposed on both sides of the display panel (e.g. to the right and left or on the right and left portions of the display panel), depending on the driving method, the design of the panel, or the like.

The display device 100 according embodiments may be a self-emitting display, such as an organic light-emitting diode (OLED) display, a quantum dot display, or a micro light-emitting diode (micro LED) display.

In a case in which the display device 100 according embodiments is an OLED display, each of the subpixels may include a self-emitting OLED as an emitting diode (i.e. a light-emitting element). In a case in which the display device 100 according embodiments is a quantum dot display, each of the subpixels may include an emitting diode comprised of a self-emitting semiconductor crystal referred to as a quantum dot. In a case in which the display device 100 according embodiments is a micro LED display, each of the subpixels may include a self-emitting and inorganic-based micro LED as an emitting diode.

The display device 100 according embodiments may be a liquid crystal display (LCD) or the like further including a light-emitting device (e.g. a backlight unit) in addition to the display panel.

The display device 100 according to embodiments may further provide a touch sensing function in addition to the display function. In this case, the display device 100 may further include a touch sensor including touch electrodes and a touch driver circuit driving the touch sensor in order to provide the touch sensing function.

Referring to FIGS. 2A and 2B, the display device 100 according to embodiments may include a bendable flexible substrate 200 and a flexible printed circuit FPC connected to a peripheral portion of the substrate 200.

Referring to FIGS. 2A and 2B, the substrate 200 may include an active area AA and a non-active area at the periphery of the non-active area AA. The active area AA is an area in which the plurality of subpixels for display driving are provided. The non-active area may include a first routing area RA1 surrounding the active area AA, a second routing area RA2 located outside of the first routing area RA1, and the like. Here, the substrate 200 may be bent, a portion of the substrate 200 corresponding to the active area AA may be directed to the front, and a portion of the substrate 200 corresponding to the second routing area RA2 (i.e. the side bezel part) may be directed to the sides.

Referring to FIGS. 2A and 2B, a driver circuit area DCA including a source pad portion connected to a source driver circuit SDC may be present in a peripheral portion of the substrate 200. For example, the source driver circuit SDC having a chip-on-bonding (COB) structure or a chip-onpanel (COP) structure may be bonded to the source pad portion of the driver circuit area DCA.

Referring to FIG. 2A, in a case in which the display device 100 according to embodiments further includes a touch driver circuit TDC for detecting touches, the touch driver circuit TDC may be mounted on the flexible printed circuit FPC or a printed circuit board (PCB) connected to the flexible printed circuit FPC.

Referring to FIG. 2B, in the driver circuit area DCA present at the periphery of the substrate 200, a touch pad portion connected to the touch driver circuit TDC may be disposed in addition to the source pad portion connected to the source driver circuit SDC. For example, the touch driver circuit TDC having the COG structure or the COP structure may be bonded to the touch pad portion of the driver circuit area DCA.

For example, as illustrated in FIG. 2b, a single source pad portion area may be disposed in the central portion of the driver circuit area DCA of the substrate 200, while two touch pad portion areas may be disposed on both sides of the single source pad portion area. The source driver circuit SDC bonded to the single source pad portion area and the touch driver circuit TDC bonded to the two touch pad portion areas may be integrated into a single source-readout integrated circuit (SRIC).

Referring to FIGS. 2A and 2B, display link lines may be disposed in at least one of the first routing area RA1, the second routing area RA2, or a combination thereof. The display link lines connect the display signal lines, such as the plurality of data lines and the plurality of gate lines, through which the plurality of subpixels disposed in the active area AA are driven, to the source driver circuit SDC and the flexible printed circuit FPC.

Referring to FIGS. 2A and 2B, touch electrodes for touch sensing may be disposed in the active area AA. In this case, the touch lines connecting the plurality of touch electrodes disposed in the active area AA and the touch driver circuit TDC may be disposed in at least one of the first routing area RA1, the second routing area RA2, or a combination thereof. As illustrated in FIG. 2A, the touch driver circuit TDC may be mounted on the flexible printed circuit FPC or a PCB connected to the flexible printed circuit FPC. Alternatively, as illustrated in FIG. 2B, the touch driver circuit TDC may be mounted on the driver circuit area DCA.

Referring to FIGS. 2A and 2B, the substrate 200 may include a bent area BA between the driver circuit area DCA and the active area AA. The bent area BA of the substrate 200 is bent such that the driver circuit area DCA, the flexible printed circuit FPC, and the like are located at the rear of the substrate 200.

Referring to FIGS. 2A and 2B, the non-active area of the substrate 200 may be bent such that second routing area RA2 is located on side surfaces of the display device 100. That is, the second routing area RA2 of the substrate 200 may correspond to the side bezel part of the display device 100.

Alternatively, referring to FIGS. 2A and 2B, the non-active area of the substrate 200 may be bent such that the first routing area RA1 of the substrate 200 is located on the side surfaces of the display device 100. That is, the first routing area RA1 of the substrate 200 may correspond to the side bezel part of the display device 100.

Alternatively, referring to FIGS. 2A and 2B, the non-active area of the substrate 200 may be bent such that the first routing area RA1 and the second routing area RA2 are located on the side surfaces of the display device 100. That is, the first routing area RA1 and the second routing area RA2 may correspond to the side bezel part of the display device 100.

In some cases, referring to FIGS. 2A and 2B, the non-active area of the substrate 200 may be bent such that the first routing area RA1 of the substrate 200 is located on the side surfaces of the display device 100, and the second routing area RA2 of the substrate 200 may be located on the rear surface of the display device 100. That is, the first routing area RA1 of the substrate 200 may correspond to the side bezel part, while the second routing area RA2 of the substrate 200 may correspond to the rear surface of the display device 100.

Referring to FIGS. 2A and 2B, the touch sensor structure is provided in at least one of the first routing area RA1, the second routing area RA2, or a combination thereof, of the substrate 200 in order to realize the soft button(s) substituting for the physical buttons. Various embodiments of the touch sensor structure provided in at least one of the first routing area RA1, the second routing area RA2, or a combination thereof, of the substrate 200 will now be described in more detail with reference to FIGS. 6 to 23.

Referring to FIG. 3, the display device 100 according to embodiments may include the touch sensor structure detecting a touch on the active area AA, in addition to the touch sensor structure realizing the soft button(s).

Referring to FIG. 3, the touch sensor structure corresponding to the active area AA of display device 100 according to embodiments may include a plurality of touch electrodes TE arranged in an area corresponding to the active area AA and a plurality of touch lines TL electrically connecting the plurality of touch electrodes TE to the touch driver circuit TDC.

The display device 100 according to embodiments may perform self-capacitance touch sensing or mutual capacitance touch sensing.

For example, the display device 100 according to embodiments may detect a touch on the basis of the self-capacitance between a touch object, such as a finger or a pen (e.g. a stylus pen), and the touch electrodes TE. In this case, the touch driver circuit TDC may detect a touch event or determine touch coordinates on the basis of the self-capacitance between the touch object and the touch electrodes TE by applying a touch driving signal to the plurality of touch electrodes TE and sensing each of the plurality of touch electrodes TE. (The term "detecting a touch event" used herein refers to "determining whether a touch has been made or not.")

In another example, the display device 100 according to embodiments may detect a touch on the basis of the mutual capacitance between the touch electrodes TE. In this case, the plurality of touch electrodes TE are categorized as driving touch electrodes and sensing touch electrodes. The touch driver circuit TDC may apply the touch driving signal to the driving touch electrodes among the plurality of touch electrodes TE and sense the sensing touch electrodes among the plurality of touch electrodes TE, thereby detecting a touch event or determine touch coordinates on the basis of the mutual capacitance between the driving touch electrodes and the sensing touch electrodes. In the plurality of touch electrodes TE, the driving touch electrodes and the sensing touch electrodes may be typically arranged to intersect each other, as illustrated in FIG. 3.

Referring to FIG. 3, for example, in touch electrodes TEr arranged in rows and touch electrodes TEc arranged in columns, the touch electrodes TEr may be the driving touch electrodes, while the touch electrodes TEc may be the sensing touch electrodes. In another example, the touch electrodes TEr may be the sensing touch electrodes, while the touch electrodes TEc may be the driving touch electrodes.

The shape, layout, and the like of the plurality of touch electrodes TE may be designed variously depending on the type of touch sensing (e.g. self-capacitance touch sensing or mutual capacitance touch sensing).

For example, in the self-capacitance touch sensing, the plurality of touch electrodes TE may have the shape of blocks that do not overlap each other. In the mutual capacitance touch sensing, the plurality of touch electrodes TE may have the shape of bars intersecting each other. Alternatively, each of the plurality of touch electrodes TE may be configured such that two or more divided portions thereof are electrically connected to each other. In this case, the plurality of touch electrodes TE may respectively have the shape of a rhombus (or a diamond), a quadrangle, or the like.

Referring to FIG. 3, the display device 100 according to embodiments may include a touch sensing circuit including the touch driver circuit TDC and a touch controller TCTR.

The touch driver circuit TDC may sense the touch electrodes TE, generate sensing data including sensing values, and output the sensing data to the touch controller TCTR. The touch controller TCTR may detect a touch event or determine touch coordinates using the sensing data.

The touch controller TCTR may be implemented as an application processor (AP) or the like.

The touch driver circuit TDC and the touch controller TCTR may be implemented as separate components or be integrated with each other to form a single component.

Referring to FIG. 4, the structure of each of the subpixels of the display device 100 will be described in brief.

Referring to FIG. 4, each of the subpixels of the display device 100 may include an emitting diode ED, a driving transistor DRT driving the emitting diode ED, a scan transistor SCT on-off controlled by a scan signal SCAN supplied through a scan line SCL (where the scan signal SCAN is a type of gate signal GATE, while the scan line SCL is a type of gate line GL) to control an electrical connection between a first node n1 of the driving transistor DRT and a data line DL, and a storage capacitor Cst electrically connected between the first node n1 and a second node n2 of the driving transistor DRT, and the like.

The subpixel structure illustrated in FIG. 4 is a basic 2T1C structure, i.e. a structure comprised of two transistors (2T) and one capacitor (1C). In some cases, each of the subpixels may further include one or more transistors, one or more capacitors, or one or more transistors and capacitors.

The emitting diode ED includes a pixel electrode PE, a common electrode CE, and an emitting layer EL located between the pixel electrode PE and the common electrode CE. The pixel electrode PE of the emitting diode ED may be an anode or a cathode, while the common electrode CE may be a cathode or an anode. The emitting diode ED may be, for example, an organic light-emitting diode (OLED), a light-emitting diode (LED), a quantum dot light-emitting diode (QDLED).

A base voltage EVSS may be applied to the common electrode CE of the emitting diode ED. The base voltage EVSS may be, for example, a ground voltage or a voltage similar to the ground voltage.

The driving transistor DRT is a transistor driving the emitting diode ED, and includes the first node n1, the second node n2, and a third node n3.

The first node n1 of the driving transistor DRT may be a node corresponding to a gate node and be electrically connected to a source node or a drain node of the scan transistor SCT.

The second node n2 of the driving transistor DRT may be electrically connected to the pixel electrode PE of the emitting diode ED and be a source node or a drain node. The third node n3 of the driving transistor DRT may be a node to which a driving voltage EVDD is applied, be electrically connected to a driving voltage line DVL through which the driving voltage EVDD is applied, and be a drain node or a source node.

The scan transistor SCT may control the connection between the first node n1 of the driving transistor DRT and a corresponding data line DL among a plurality of data lines DL, in response to the scan signal SCAN supplied through a corresponding scan line SCL, i.e. a type of gate line GL, among the plurality of scan lines SCL.

The drain node or the source node of the scan transistor SCT may be electrically connected to the corresponding data line DL. The source node or the drain node of the scan transistor SCT may be electrically connected to the first node n1 of the driving transistor DRT. The gate node of the scan transistor SCT may be electrically connected to the scan line SCL, i.e. a type of gate line GL, to have the scan signal SCAN applied thereto.

The scan transistor SCT may be turned on by the scan signal SCAN having a turn-on level gate voltage to transfer an image data voltage Vdata, supplied through the corresponding data line DL, to the first node n1 of the driving transistor DRT.

The scan transistor SCT is turned on by the scan signal SCAN having a turn-on level gate voltage and is turned off by the scan signal SCAN having a turn-off level gate voltage. In a case in which the scan transistor SCT is an N-type transistor, the turn-on level gate voltage may be a high level voltage, while the turn-off level gate voltage may be a low level voltage. In a case in which the scan transistor SCT is a P-type transistor, the turn-on level gate voltage may be a low level voltage, while the turn-off level gate voltage may be a high level voltage.

The storage capacitor Cst may be electrically connected to the first node n1 and the second node n2 of the driving transistor DRT and maintain the image data voltage Vdata corresponding to an image signal voltage or a voltage corresponding to the image data voltage Vdata for a single-frame time.

The storage capacitor Cst may be an external capacitor intentionally designed to be outside the driving transistor DRT, instead of being a parasitic capacitor (e.g. Cgs or Cgd), i.e. an internal capacitor, present between the first node n1 and the second node n2 of the driving transistor DRT.

Each of the driving transistor DRT and the scan transistor SCT may be an N-type transistor or a P-type transistor. Both the driving transistor DRT and the scan transistor SCT may be N-type transistors or P-type transistors. One of the driving transistor DRT and the scan transistor SCT may be an N-type transistor (or a P-type transistor), while the other of the driving transistor DRT and the scan transistor SCT may be a P-type transistor (or an N-type transistor). The structure of each of the subpixels illustrated in FIG. 4 is merely an example for explanation. The subpixel structure may further include one or more transistors, or in some cases, may further include one or more capacitors. Alternatively, the entirety of the plurality of subpixels may have the same structure, or some of the plurality of subpixels may have a different structure.

Referring to FIGS. 1, 2A, 2B, and 5, the display device 100 according to embodiments may include the substrate 200 including the active area AA on which images are displayed and the non-active area NA on which no images are displayed, a transistor array layer 520 located over the substrate 200 and in which a plurality of transistors (e.g. DRT and SCT) are provided, an insulating layer 530 located over the transistor array layer 520 in which the plurality of transistors are provided, an emitting diode layer 540 located over the insulating layer 530 and in which the emitting diode ED is provided, and an encapsulation layer 550 provided over the emitting diode layer 540.

The emitting diode layer 540 may include the plurality of pixel electrodes PE, the plurality of emitting layers EL located over the plurality of pixel electrodes PE, the common electrode CE located over the plurality of emitting layers EL, and the like.

The encapsulation layer 550 may be located over the common electrode CE of the emitting diode layer 540 while being located between the active area AA and the first routing area RA1. The encapsulation layer 550 may have an inclined surface in the first routing area RA1.

The display device 100 according to embodiments may further include one or more dams located at the boundary between the first routing area RA1 and the second routing area RA2. The heights of the dams may be higher than those of the surroundings.

Referring to FIGS. 1, 2A, 2B, and 5, the display device 100 according to embodiments may include side edge touch electrodes STE located in at least one of the first routing area RA1, the second routing area RA2, or a combination thereof, in order to realize the soft button(s). According to the example of FIG. 5, the side edge touch electrodes STE may be disposed in the second routing area RA2. The display device 100 according to embodiments may further include side edge touch lines located in at least one of the first routing area RA1, the second routing area RA2, or a combination thereof, and electrically connected to the side edge touch electrodes STE.

Referring to the example of FIG. 5, in the first routing area RA1, a base voltage electrode 560 through which the base voltage EVSS is supplied and a power pattern 570 electrically connected to the base voltage electrode 560 may be disposed on the substrate.

Referring to FIG. 5, a device structure 510 may be disposed on the rear surface of the substrate 200 such that the substrate 200 is bent along the device structure 510. Accordingly, the side edge touch electrodes STE may be disposed on a side surface of the display device 100, thereby providing the soft button(s) in the side bezel part.

The encapsulation layer 550 may be a single layer or, as illustrated in FIG. 5, be comprised of a plurality of layers 551, 552, and 553. For example, the encapsulation layer 550 may have a multilayer configuration in which a first inorganic encapsulation layer 551, an organic encapsulation layer 552, a second inorganic encapsulation layer 553, and the like are stacked on each other.

The display device 100 according to embodiments may be, for example, a mobile device, such as a smartphone or a tablet computer, a computing device, such as a notebook computer, including a display panel, or any other electronic device, such as a TV, a kiosk, or an information display device, including a display panel.

Hereinafter, embodiments of a planar structure of the touch sensor structure realizing the soft button(s) in the side edge touch sensing area according to embodiments will be described with reference to FIGS. 6 to 10, and embodiments of a cross-sectional structure of the touch sensor structure realizing the soft button(s) in the side edge touch sensing area according to embodiments will be described with reference to FIGS. 11 to 22.

FIGS. 6 to 10 illustrate examples of the side edge touch electrodes STE in the display device 100 according to embodiments. In these examples, the touch driver circuit TDC will be described as being mounted on the flexible printed circuit FPC or a printed circuit board (PCB) connected to the flexible printed circuit FPC, as illustrated in FIG. 2A.

Figure 6:
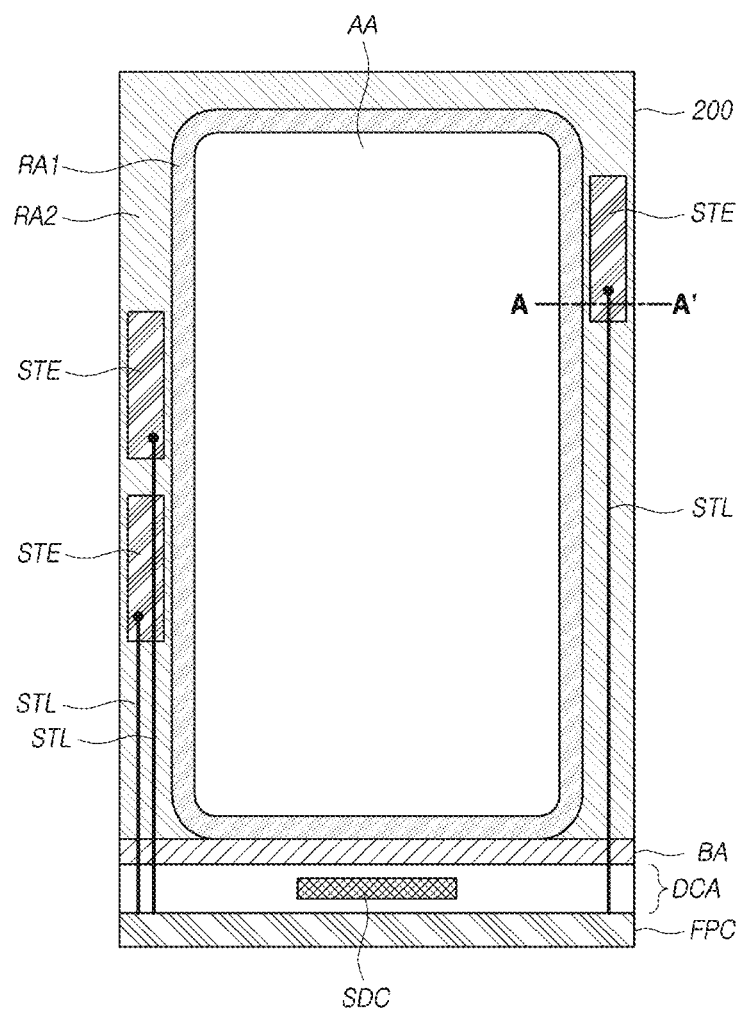
FIGS. 6 to 10 illustrate examples of the side edge touch electrodes in the display device according to embodiments.
Figure 7:
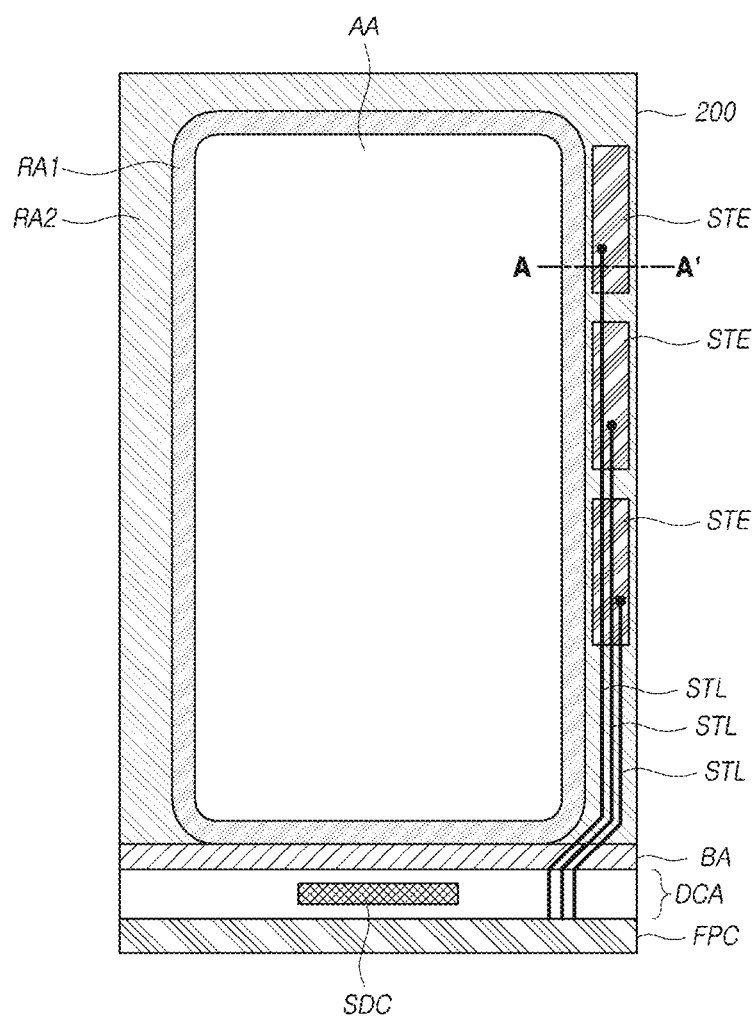
Figure 8:
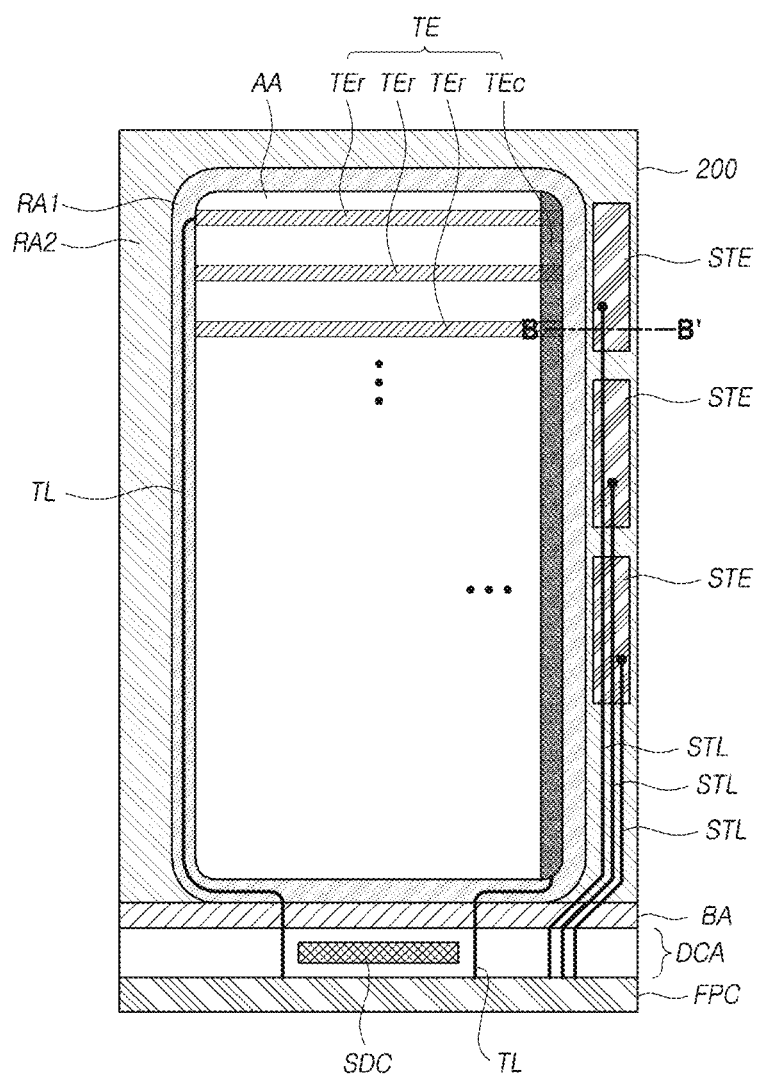

Referring to FIGS. 6 to 8, one or more side edge touch electrodes STE may be disposed in the second routing area RA2 of the first routing area RA1 and the second routing area RA2 included in the non-active area NA of the substrate 200. One or more side edge touch lines STL electrically connected to the one or more side edge touch electrodes STE may be disposed in the second routing area RA2 of the first routing area RA1 and the second routing area RA2.

As illustrated in FIG. 6, some of the plurality of side edge touch electrodes STE may be disposed in the second routing area RA2 located on one side of the active area AA, while the others of the plurality of side edge touch electrodes STE may be disposed in the second routing area RA2 located on the other side of the active area AA. Alternatively, as illustrated in FIGS. 7 and 8, all of the one or more side edge touch electrodes STE may be disposed in the second routing area RA2 located on one side of the active area AA.

Referring to FIGS. 6 to 8, in an example, the touch sensing circuit may obtain sensing values through the side edge touch electrodes STE, respectively, and on the basis of the obtained sensing values, determine whether or not a user has touched the bezel part in which the respective side edge touch electrodes STE are located. The sensing values may be values corresponding to self-capacitance, or variations thereof, formed between the side edge touch electrodes STE and an object, such as a finger.

Referring to FIG. 8, the one or more side edge touch electrodes STE and the one or more side edge touch lines STL may be disposed, entirely irrespective of the touch sensor structure disposed in the active area AA. The touch driver circuit TDC may drive and sense the side edge touch electrodes STE disposed in the non-active area NA, irrespective of the driving and sensing operations of the touch electrodes TEr and TEc disposed in the active area AA.

Figure 9:
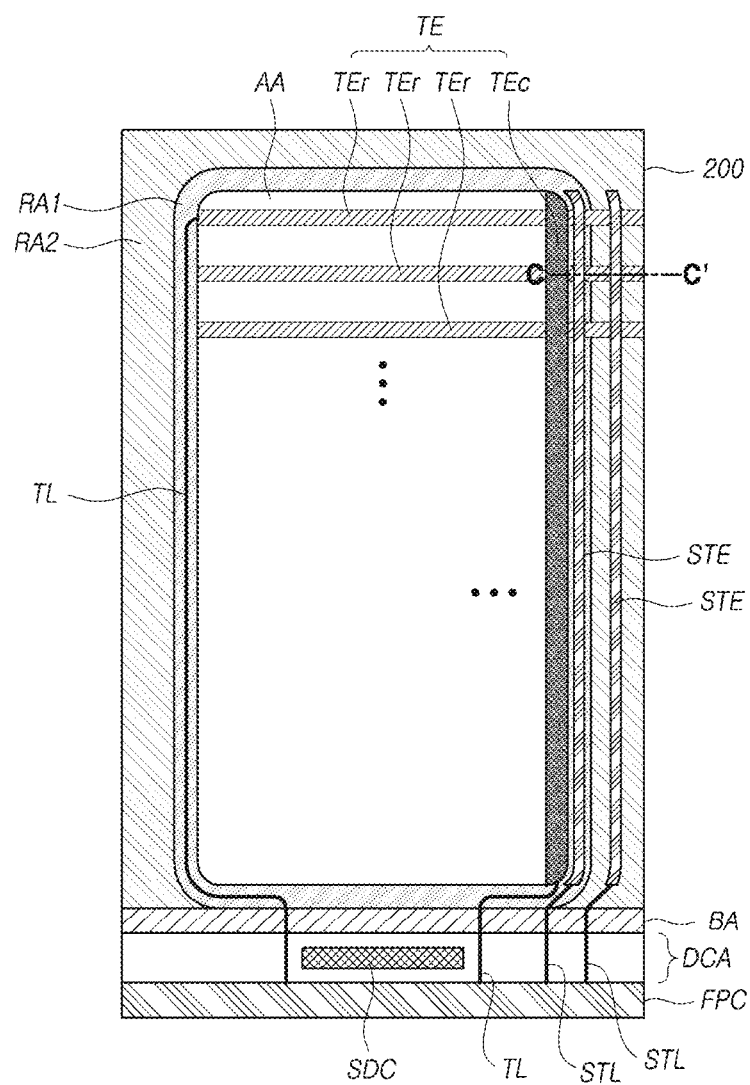

Referring to FIG. 9, one or more side edge touch electrodes STE may be disposed in the first routing area RA1, and one or more side edge touch electrodes STE may be disposed in the second routing area RA2.

Referring to FIG. 9, one or more side edge touch lines STL may be disposed in the first routing area RA1, and one or more side edge touch lines STL may be disposed in the second routing area RA2.

Referring to FIG. 9, at least one touch electrode TEr among the touch electrodes TE (TEr and TEc) disposed in the active area AA may extend from the non-active area AA to the first and second routing areas RA1 and RA2 in which the side edge touch electrodes STE are disposed.

The at least one touch electrode TEr extending to the first and second routing areas RA1 and RA2 may intersect the side edge touch electrodes STE disposed in the first and second routing areas RA1 and RA2.

Mutual capacitance may be formed between the at least one touch electrode TEr extending to the first and second routing areas RA1 and RA2 and the side edge touch electrodes STE disposed in the first and second routing areas RA1 and RA2.

Regarding the mutual capacitance touch sensing, the at least one touch electrode TEr extending to the first and second routing areas RA1 and RA2 serves as the driving touch electrode, while the side edge touch electrodes STE disposed in the first and second routing areas RA1 and RA2 may serve as the sensing touch electrode.

The touch sensing circuit may obtain sensing values by sensing the side edge touch electrodes STE disposed in the first and second routing areas RA1 and RA2 and, on the basis of the obtained sensing values, determine whether or not the user has touched the bezel part in which one or more side edge touch electrodes among the side edge touch electrodes STE are located. The sensing values may correspond to mutual capacitance, or variations thereof, formed between the at least one touch electrode TEr extending to the first and second routing areas RA1 and RA2 and the side edge touch electrodes STE disposed in the first and second routing areas RA1 and RA2.

Figure 10:
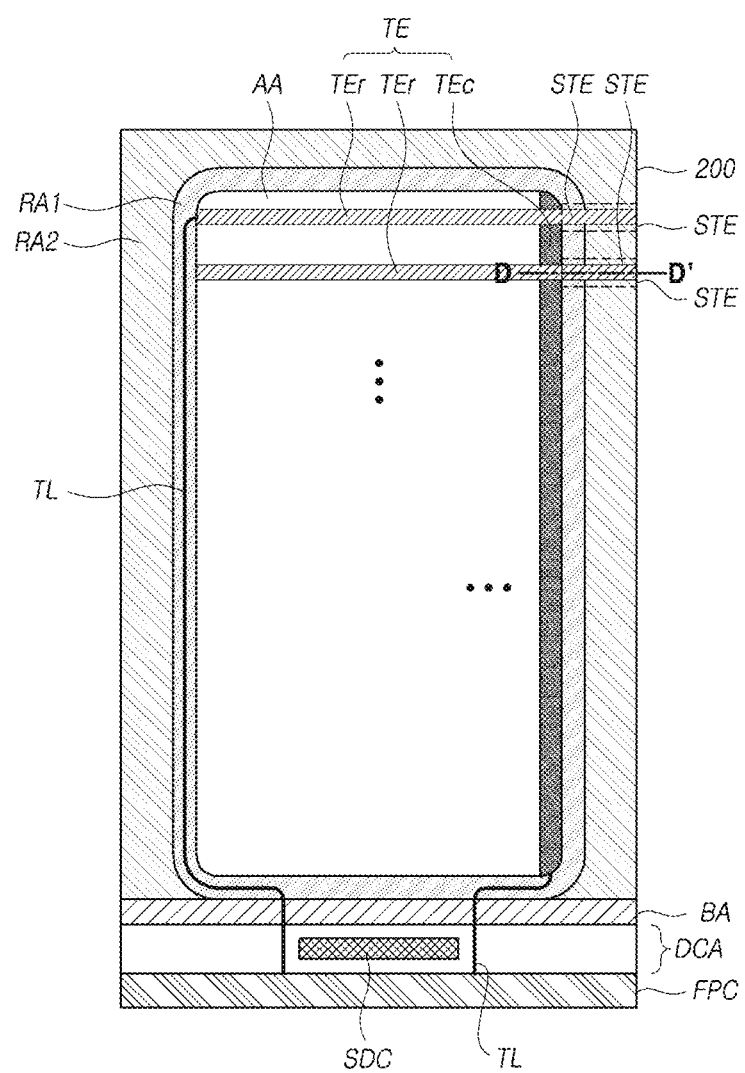

Referring to FIG. 10, one or more touch electrodes TEr among the touch electrodes TE (TEr and TEc) disposed in the active area AA may be disposed to extend from the non-active area AA to the first routing area RA1. Alternatively, one or more touch electrodes TEr among the touch electrodes TE (TEr and TEc) disposed in the active area AA may extend beyond the first routing area RA1 to the second routing area RA2 in the non-active area NA.

The one or more touch electrodes TEr extending to the first and second routing areas RA1 and RA2 may be the one or more side edge touch electrodes STE realizing the soft button(s). Thus, one or more touch lines TL electrically connected to the one or more touch electrodes TEr extending to the first and second routing areas RA1 and RA2 may serve as the one or more side edge touch lines STL.

The one or more side edge touch electrodes STE corresponding to the one or more touch electrodes TEr extending to the first and second routing areas RA1 and RA2 may intersect the other touch electrodes TEc among the touch electrodes TE (TEr and TEc) disposed in the active area AA.

Accordingly, the one or more side edge touch electrodes STE corresponding to the one or more touch electrodes TEr extending to the first and second routing areas RA1 and RA2 may form mutual capacitance with other touch electrodes TEc among the touch electrodes TE (TEr and TEc) disposed in the active area AA.

Regarding the mutual capacitance touch sensing, the one or more side edge touch electrodes STE corresponding to the one or more touch electrodes TEr extending to the first and second routing areas RA1 and RA2 serve as the sensing touch electrodes, while the other touch electrodes TEc in the active area AA, intersecting the one or more side edge touch electrodes STE, serve as the sensing touch electrodes.

The touch sensing circuit may obtain sensing values by sensing the one or more side edge touch electrodes STE corresponding to the one or more touch electrodes TEr extending to the first and second routing areas RA1 and RA2 and, on the basis of the obtained sensing values, determine whether or not the user has touched the bezel part in which one or more side edge touch electrodes among the side edge touch electrodes STE are located. The sensing values may be mutual capacitance, or variations thereof, formed between the one or more side edge touch electrodes STE corresponding to the one or more touch electrodes TEr extending to the first and second routing areas RA1 and RA2 and the other touch electrodes TEc among the touch electrodes TE (TEr and TEc) disposed in the active area AA.

The touch sensing circuit may compare and analyze the sensing values of the touch electrodes TEr not extending to the first and second routing areas RA1 and RA2 and the sensing values of the one or more touch electrodes TEr extending to the first and second routing areas RA1 and RA2, thereby accurately determining whether the user has touched a portion of one or more touch electrodes TEr extending to the first and second routing areas RA1 and RA2, located in the active area AA, or a portion of the one or more touch electrodes TEr extending to the first and second routing areas RA1 and RA2, located in the first or second routing area RA1 or RA2 of the non-active area NA.

Hereinafter, the cross-sectional structures of the A-A' portion of the planar structures of FIGS. 6 and 7 will be described with reference to FIGS. 11 to 18. The cross-sectional structure of the B-B' portion of the planar structure of FIG. 8 will be described with reference to FIG. 19. The cross-sectional structure of the C-C' portion of the planar structure of FIG. 9 will be described with reference to FIG. 20. The cross-sectional structure of the D-D' portion of the planar structure of FIG. 10 will be described with reference to FIG. 20.

FIGS. 11 to 18 are a variety of cross-sectional views taken along line A-A' in the plan views of FIGS. 6 and 7.

First, a common cross-sectional structure of the active areas AA among the display devices 100 illustrated in FIGS. 11 to 18 will be described. In FIGS. 11 to 18, the driving transistor DRT is illustrated.

The substrate 200 of the display panel includes the active area AA on which images are displayed and the non-active area NA on which no images are displayed. The non-active area NA includes the first routing area RA1 and the second routing area RA2.

The substrate 200 may be a flexible substrate.

A multi-buffer layer 1110 and an active buffer layer 1120 may be disposed over the substrate 200.

In the active area AA, the transistor array layer 520 may be located over the substrate 200. A plurality of transistors DRT located in the active area AA are provided in the transistor array layer 520.

To form the transistor array layer 520, an active layer ACT of each of the transistors DRT may be provided, and a gate insulating film 1130 may be provided over the active layer ACT.

A gate electrode GE is provided over the gate insulating film 1130, and a second insulating layer 1140 is provided over the gate electrode GE. A metal layer TM may be provided over the second insulating layer 1140, and a first insulating layer 1150 may be provided over the metal layer TM.

A source electrode SE and a drain electrode DE may be provided over the first insulating layer 1150. The source electrode SE and the drain electrode DE may be connected to the active layer ACT via a triple contact hole in the first insulating layer 1150, the second insulating layer 1140, and the gate insulating film 1130.

The portions of the active layer ACT to which the source electrode SE and the drain electrode DE are connected may be conductorized portions, while the remaining portion may overlap the gate electrode GE to form a channel.

The transistor array layer 520 including the plurality of transistors DRT may extend to this location, and a device insulating layer 1160 may be provided over the transistor array layer 520.

The device insulating layer 1160 may be disposed over the first insulating layer 1150 while covering the source electrode SE and the drain electrode DE provided over the first insulating layer 1150.

The device insulating layer 1160 may correspond to the insulating layer 530, illustrated in FIG. 5, insulating the transistor array layer 520 under the device insulating layer 1160 and the emitting diode layer 540 over the device insulating layer 1160, and may have a planarization function.

In the emitting diode layer 540, the plurality of pixel electrodes PE may be located over the device insulating layer 1160, and each of the pixel electrodes PE may be connected to the source electrode SE or the drain electrode DE via a contact hole in the device insulating layer 1160. The plurality of emitting layers EL are located over the plurality of pixel electrodes PE. The common electrode CE is located over the plurality of emitting layers EL A bank 1170 may cover a portion of the pixel electrode PE. The emitting area of each of the subpixels may be defined by the bank 1170. The emitting layer EL may be disposed over a portion of the pixel electrode PE not covered by the bank 1170.

The encapsulation layer 550 may be located over the common electrode CE. The encapsulation layer 550 located over the common electrode CE may be located in the active area AA and the first routing area RA1 and have an inclined surface 1100 in the first routing area RA1.

In the display panel, one or more dams DAM1 and DAM2 able to prevent the encapsulation layer 550, in particular, the organic encapsulation layer 552 from collapsing may be provided over peripheral portions of the encapsulation layer 550 or the surroundings of the peripheral portions.

The heights of the one or more dams DAM1 and DAM2 may be higher than those of the surroundings.

The one or more dams DAM1 and DAM2 may be located in the boundary between the first routing area RA1 and the second routing area RA2. That is, in the non-active area NA, the first routing area RA1 and the second routing area RA2 may be divided by the one or more dams DAM1 and DAM2.

As illustrated in FIGS. 11 to 18, the side edge touch electrodes STE may be located in at least one of the first routing area RA1, the second routing area RA2, or a combination thereof. The side edge touch lines STL electrically connected to the side edge touch electrodes STE may be located in at least one of the first routing area RA1, the second routing area RA2, or a combination thereof.

The cross-sectional structure of the second routing area RA2 in which the side edge touch electrodes STE are located will be described with reference to FIGS. 11 to 18. The first insulating layer 1150 may be located under the side edge touch electrodes STE. The metal layer TM may be located under the first insulating layer 1150. The second insulating layer 1140 may be located under the metal layer TM. A gate electrode material layer GML may be located under the second insulating layer 1140. The gate electrode material layer GML may contain the same gate electrode material as the gate electrodes GE of the plurality of transistors DRT.

Figure 11:
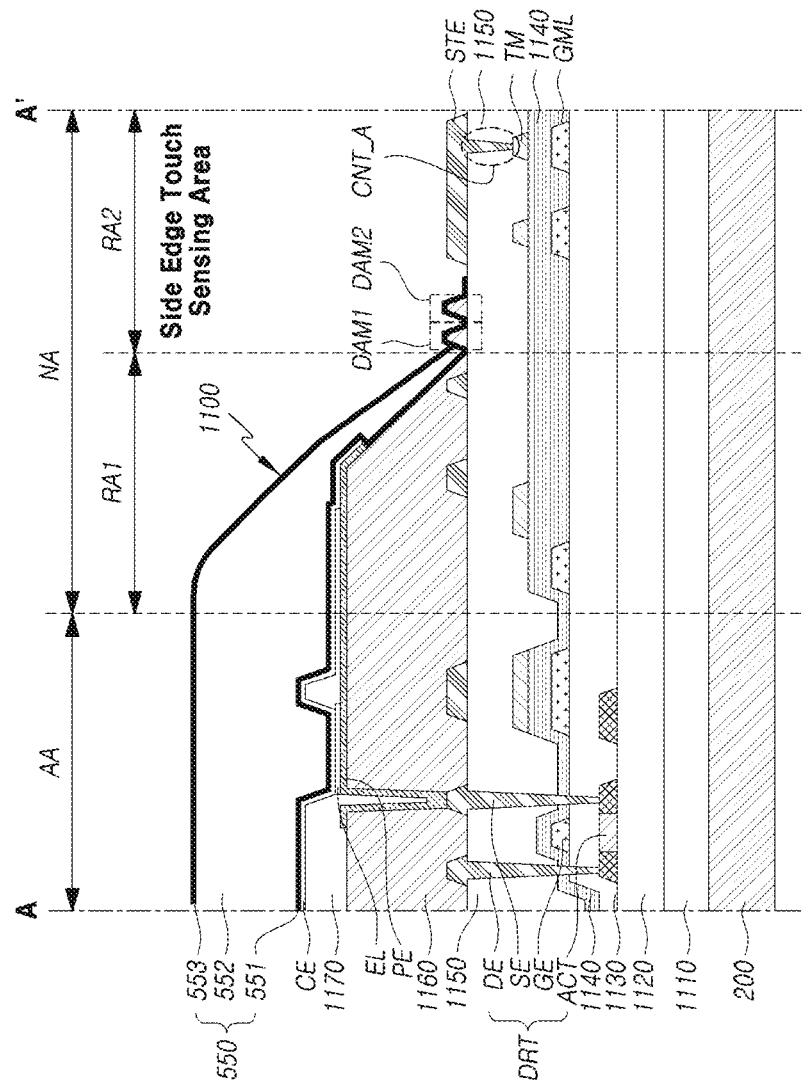
FIGS. 11 to 18 are a variety of cross-sectional views taken along line A-A' in the plan views of FIGS. 6 and 7.
Figure 12:
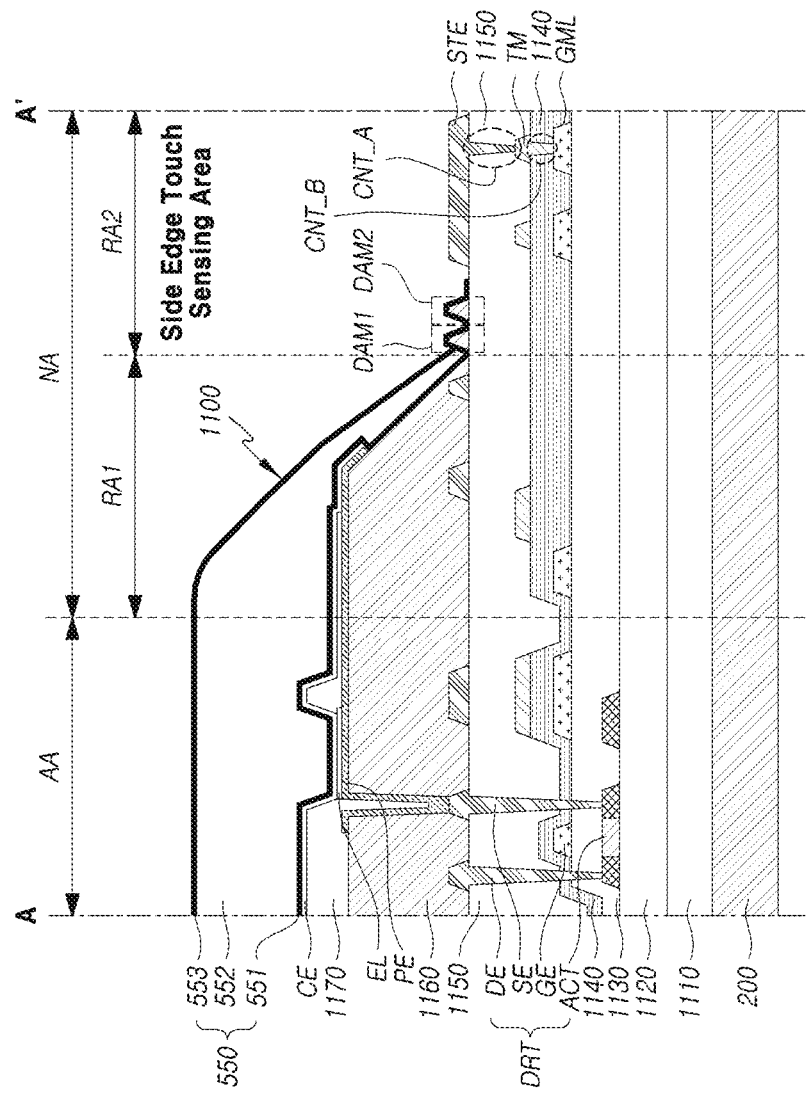
Figure 13:
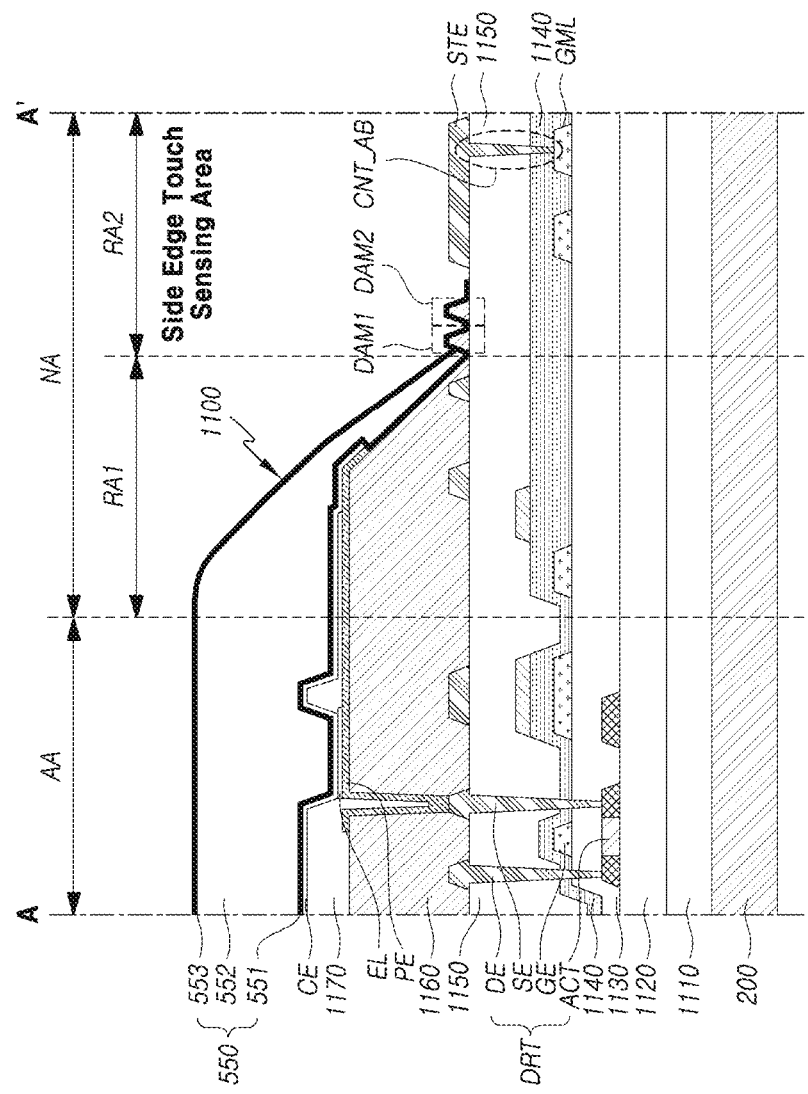

Referring to FIGS. 11 to 13, the side edge touch electrodes STE may contain the same source/drain electrode material as the source electrode SE and the drain electrode DE of the plurality of transistors DRT.

Referring to FIG. 11, the side edge touch electrodes STE may be electrically connected to the metal layer TM via a contact hole CNT_A in the first insulating layer 1150. The metal layer TM may be intended to increase the effective electrode area of the side edge touch electrodes STE, thereby increasing capacitance, or be the side edge touch lines STL through which signals are transferred. The effective electrode area may mean a substantial total area (i.e. an area in terms of signal application) including the electrode area of an electrode pattern to which the same signal is further applied even in the case that the electrode pattern is made of a different material than that of the side edge touch electrodes STE and the electrode area of the side edge touch electrodes TE.

In addition, in the active area AA, the metal layer TM may serve as one electrode of two electrodes of the storage capacitor Cst in the subpixel structure illustrated in FIG. 4. Referring to FIG. 11, for example, in the active area AA, the metal layer TM may overlap the gate electrode GE of the driving transistor DRT or the gate electrode material layer GML electrically connected to the gate electrode GE, with the second insulating layer 1140 being provided therebetween, thereby forming the storage capacitor Cst. The gate electrode material layer GML and the metal layer TM may correspond to the two electrodes of the storage capacitor Cst.

In addition, in the active area AA, the metal layer TM may be used as display line metals, such as the variety of gate lines GL, or display electrode metals.

Referring to FIG. 12, the metal layer TM may be electrically connected to the side edge touch electrodes STE via the contact hole CNT_A in the first insulating layer 1150 while being electrically connected to the gate electrode material layer GML via a contact hole CNT_B in the second insulating layer 1140. The metal layer TM, the gate electrode material layer GML, or both the metal layer TM and the gate electrode material layer GML may be intended to increase the effective electrode area of the side edge touch electrodes STE, thereby increasing capacitance, or be the side edge touch lines STL through which signals are transferred.

Referring to FIG. 13, the side edge touch electrodes STE may be electrically connected to the gate electrode material layer GML via a double contact hole CNT_AB in the first insulating layer 1150 and the second insulating layer 1140. The gate electrode material layer GML may be intended to increase the effective electrode area of the side edge touch electrodes STE, thereby increasing capacitance, or be the side edge touch lines STL through which signals are transferred.

Referring to FIGS. 14 to 18, the side edge touch electrodes STE may contain the same pixel electrode material as the plurality of pixel electrodes PE.

Figure 14:
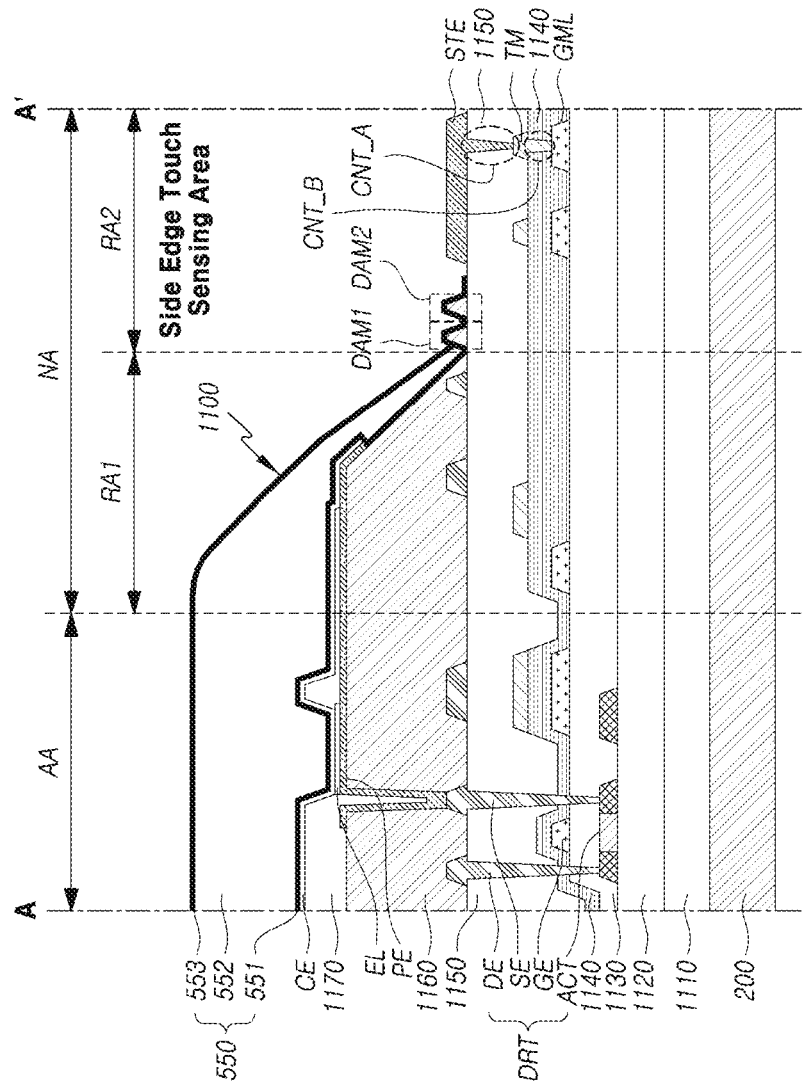
Figure 15:
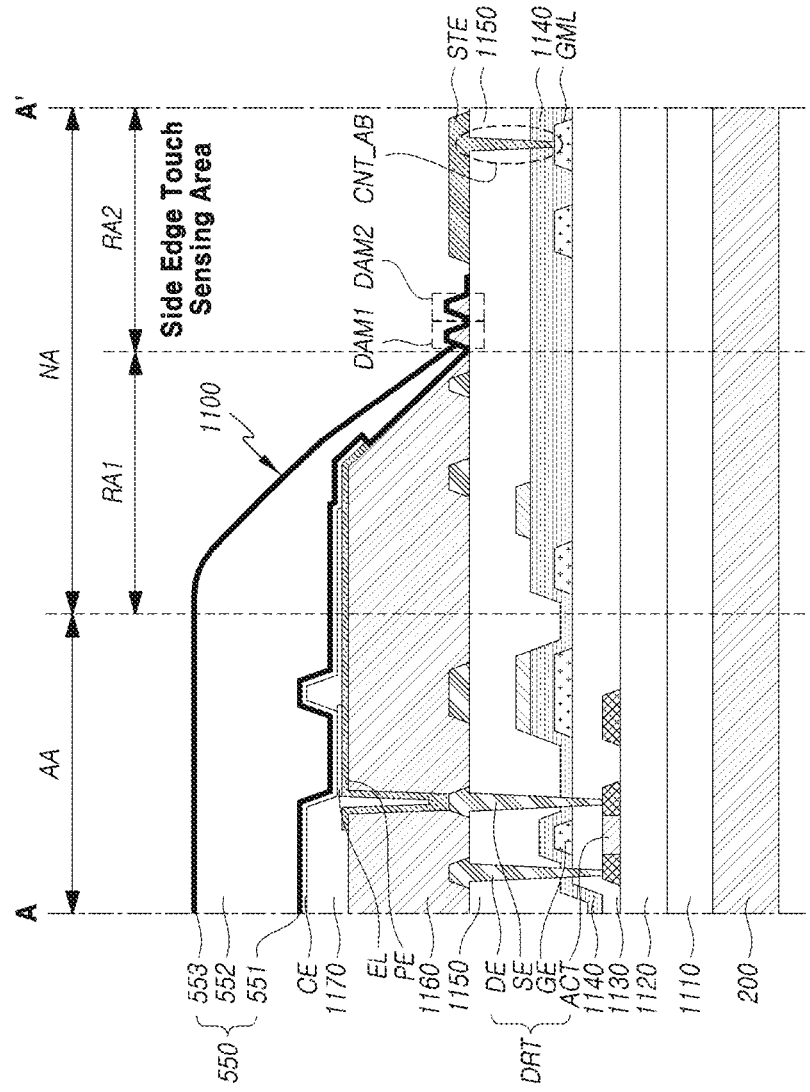

Referring to FIGS. 14 and 15, in the active area AA, a source/drain electrode material layer in which the source electrode SE and the drain electrode DE are disposed is located over the first insulating layer 1150. In contrast, in the non-active area NA, the pixel electrode material layer providing the side edge touch electrodes STE may be located over the first insulating layer 1150.

Referring to FIG. 14, the side edge touch electrodes STE may be electrically connected to the metal layer TM via the contact hole CNT_A in the first insulating layer 1150. The metal layer TM may be electrically connected to the gate electrode material layer GML via the contact hole CNT_B in the second insulating layer 1140. The metal layer TM, the gate electrode material layer GML, or both the metal layer TM and the gate electrode material layer GML may be intended to increase the effective electrode area of the side edge touch electrodes STE, thereby increasing capacitance, or be the side edge touch lines STL.

Referring to FIG. 15, the side edge touch electrodes STE may be electrically connected to the gate electrode material layer GML via the double contact hole CNT_AB in the first insulating layer 1150 and the second insulating layer 1140. The gate electrode material layer GML may be intended to increase the effective electrode area of the side edge touch electrodes STE, thereby increasing capacitance, or be the side edge touch lines STL through which signals are transferred.

Figure 16:
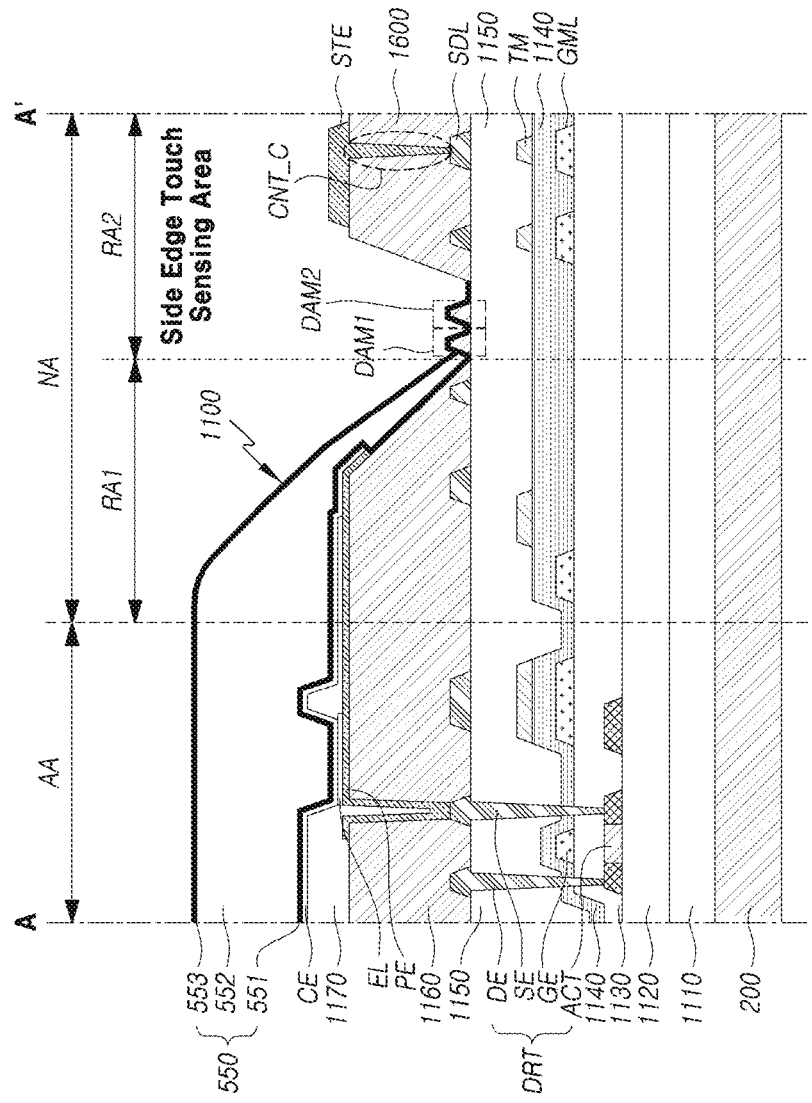
Figure 17:
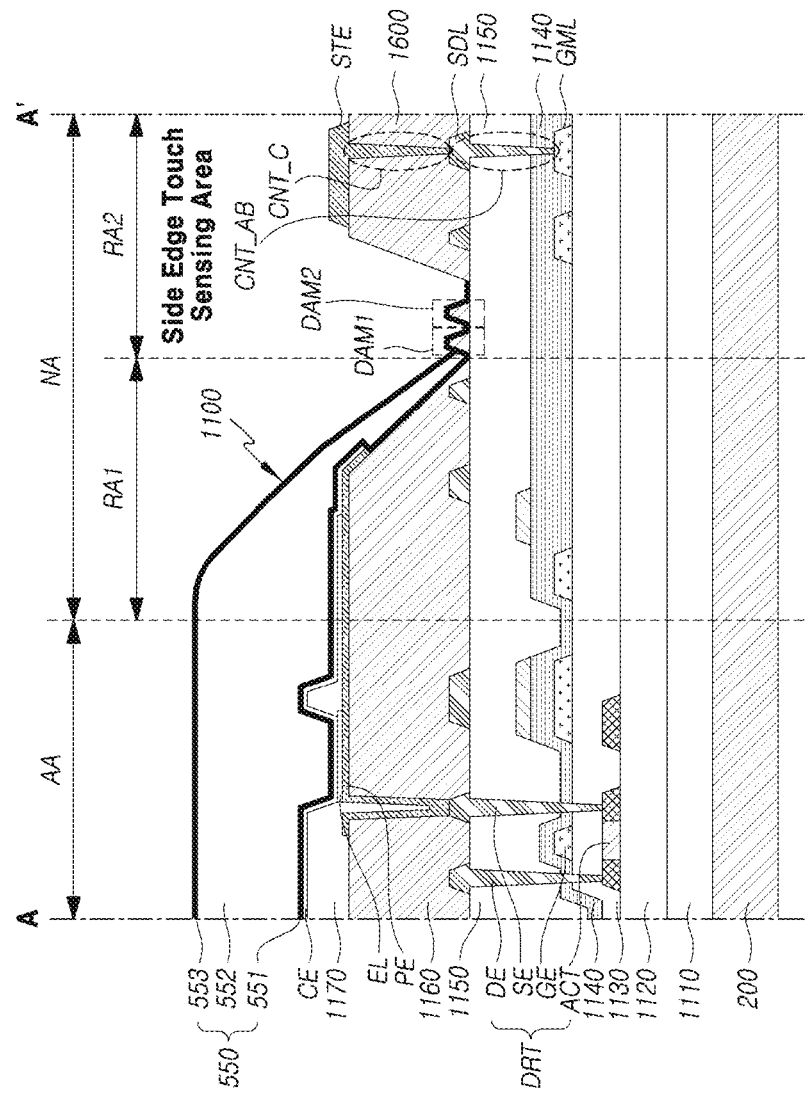
Figure 18:
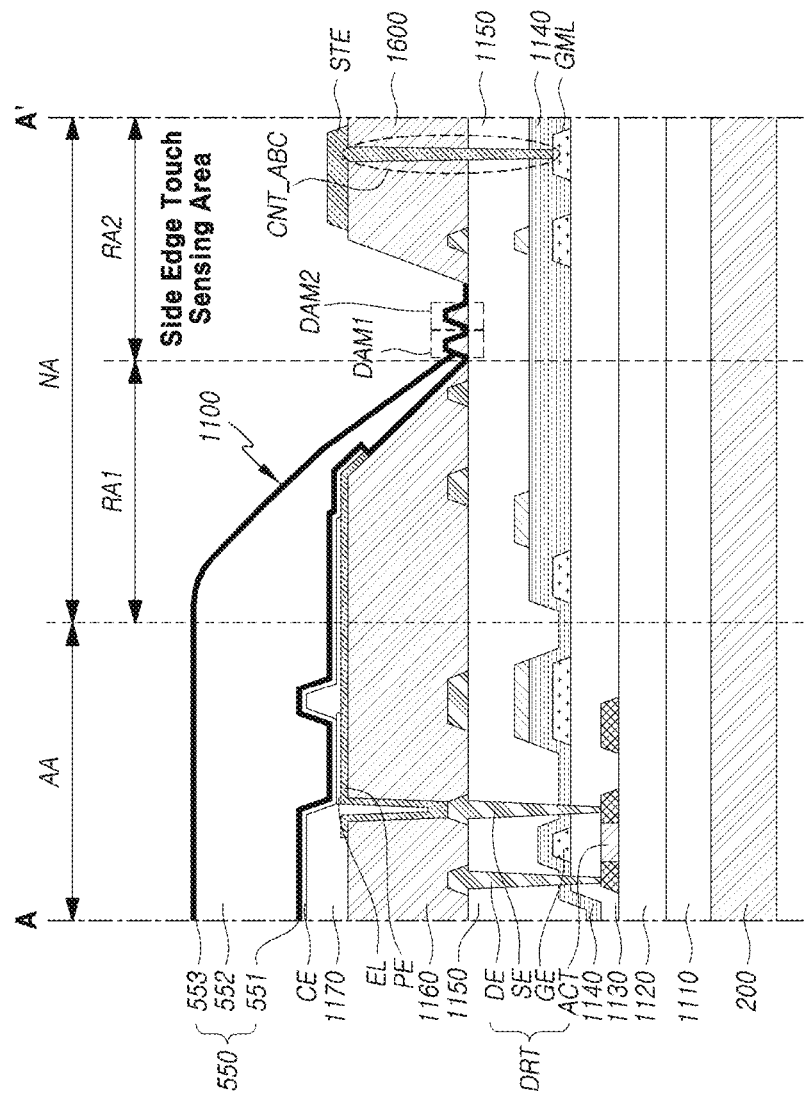

Referring to FIGS. 16 to 18, a source/drain electrode material layer SDL may be located over the first insulating layer 1150. A peripheral insulating layer 1600 may be provided over the source/drain electrode material layer SDL, located in the non-active area NA. The peripheral insulating layer 1600 may contain the same material as the device insulating layer 1160.

The side edge touch electrodes STE containing the pixel electrode material may be located over the peripheral insulating layer 1600. That is, the peripheral insulating layer 1600 may be located under the side edge touch electrodes STE containing the pixel electrode material.

The source/drain electrode material layer SDL may contain the same source/drain electrode material as the source electrode SE and the drain electrode DE of the plurality of transistors DRT.

Referring to FIG. 16, the side edge touch electrodes STE containing the pixel electrode material may be electrically connected to the source/drain electrode material layer SDL via a contact hole CNT_C in the peripheral insulating layer 1600. The source/drain electrode material layer SDL may be intended to increase the effective electrode area of the side edge touch electrodes STE, thereby increasing capacitance, or be the side edge touch lines STL through which signals are transferred.

Referring to FIG. 17, the side edge touch electrodes STE containing the pixel electrode material may be electrically connected to the source/drain electrode material layer SDL via the contact hole CNT_C in the peripheral insulating layer 1600. In addition, the source/drain electrode material layer SDL may be electrically connected to the side edge touch electrodes STE via the contact hole CNT_C in the peripheral insulating layer 1600 and be electrically connected to the gate electrode material layer GML via a double contact hole CNT_AB in the first insulating layer 1150 and the second insulating layer 1140. Here, the source/drain electrode material layer SDL, the gate electrode material layer GML, or both the source/drain electrode material layer SDL and the gate electrode material layer GML may be intended to increase the effective electrode area of the side edge touch electrodes STE, thereby increasing capacitance, or be the side edge touch lines STL through which signals are transferred.

Referring to FIG. 18, the side edge touch electrodes STE containing the pixel electrode material may be electrically connected to the gate electrode material layer GML via a triple contact hole CNT_ABC in the peripheral insulating layer 1600, the first insulating layer 1150, and the second insulating layer 1140. The gate electrode material layer GML may be intended to increase the effective electrode area of the side edge touch electrodes STE, thereby increasing capacitance, or be the side edge touch lines STL through which signals are transferred.

As a modified structure of FIG. 16, the side edge touch electrodes STE may be connected to the source/drain electrode material layer SDL via the contact hole CNT_C in the peripheral insulating layer 1600, while the source/drain electrode material layer SDL may be connected to the metal layer TM via the contact hole CNT_A in the first insulating layer 1150. In addition, the metal layer TM may be electrically connected to the gate electrode material layer GML via the contact hole CNT_B in the second insulating layer 1140. Here, at least one of the source/drain electrode material layer SDL, the metal layer TM, the gate electrode material layer GML, or combinations thereof, may be intended to increase the effective electrode area of the side edge touch electrodes STE, thereby increasing capacitance, or be the side edge touch lines STL through which signals are transferred.

As a modified structure of FIGS. 16 to 18, the side edge touch electrodes STE may be electrically connected to the metal layer TM via a double contact hole in the peripheral insulating layer 1600 and the first insulating layer 1150. Here, the metal layer TM may be intended to increase the effective electrode area of the side edge touch electrodes STE, thereby increasing capacitance, or be the side edge touch lines STL through which signals are transferred.

Hereinafter, the touch sensor structure realizing the soft button(s) in at least one of the first routing area RA1, the second routing area RA2, or a combination thereof, of the non-active area NA, provided in addition to the touch sensor structure provided in the active area AA, will be described with reference to FIGS. 19 to 22. Herein, the touch electrodes TE may also be referred to as touch sensors.

Figure 19:
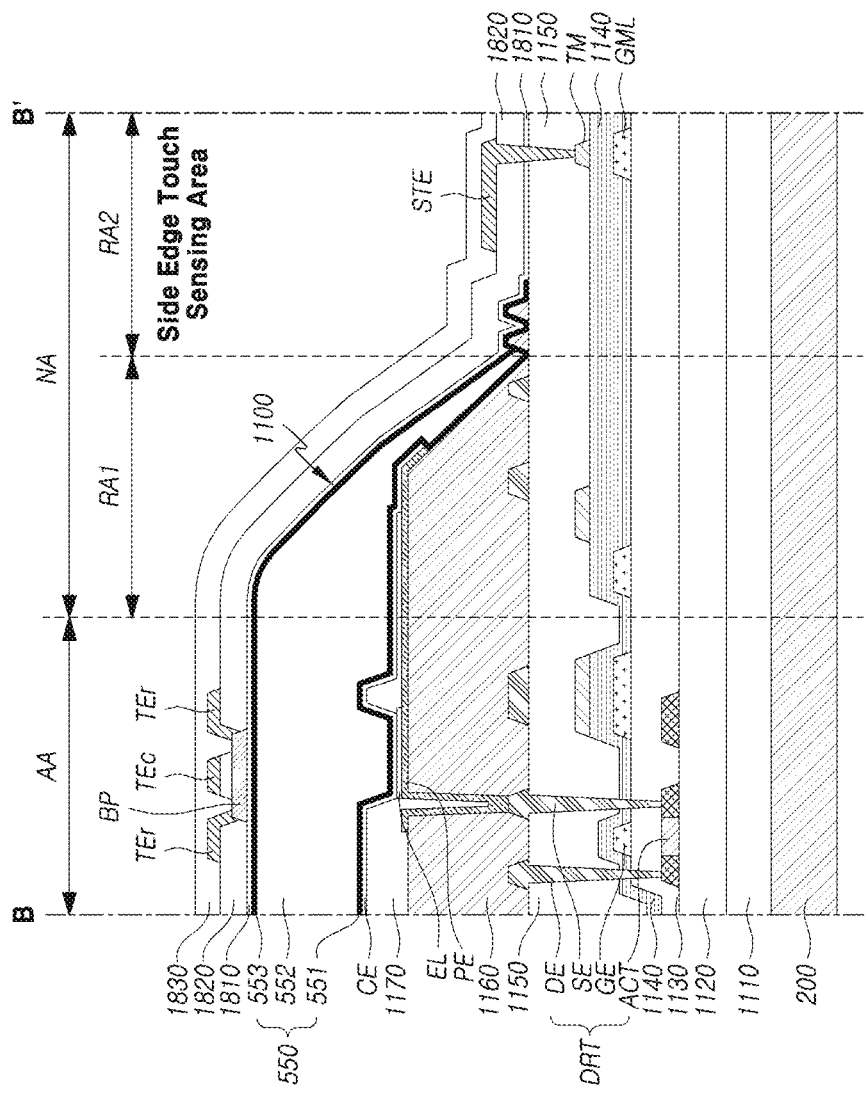
FIG. 19 is a cross-sectional view taken along line B-B' in the plan view of FIG. 8.
Figure 20:
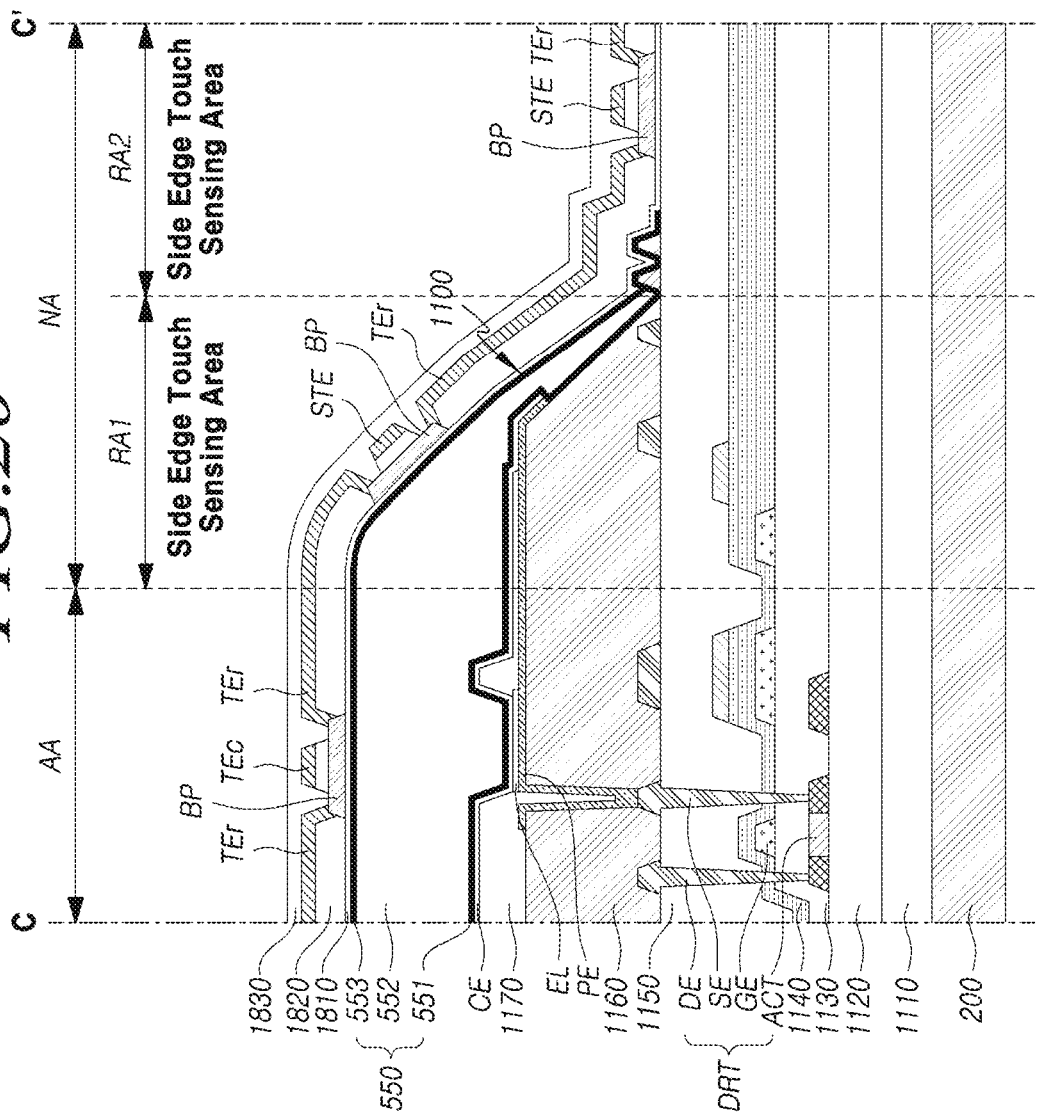
FIG. 20 is a cross-sectional view along line C-C' in the plan view of FIG. 9.
Figure 21:
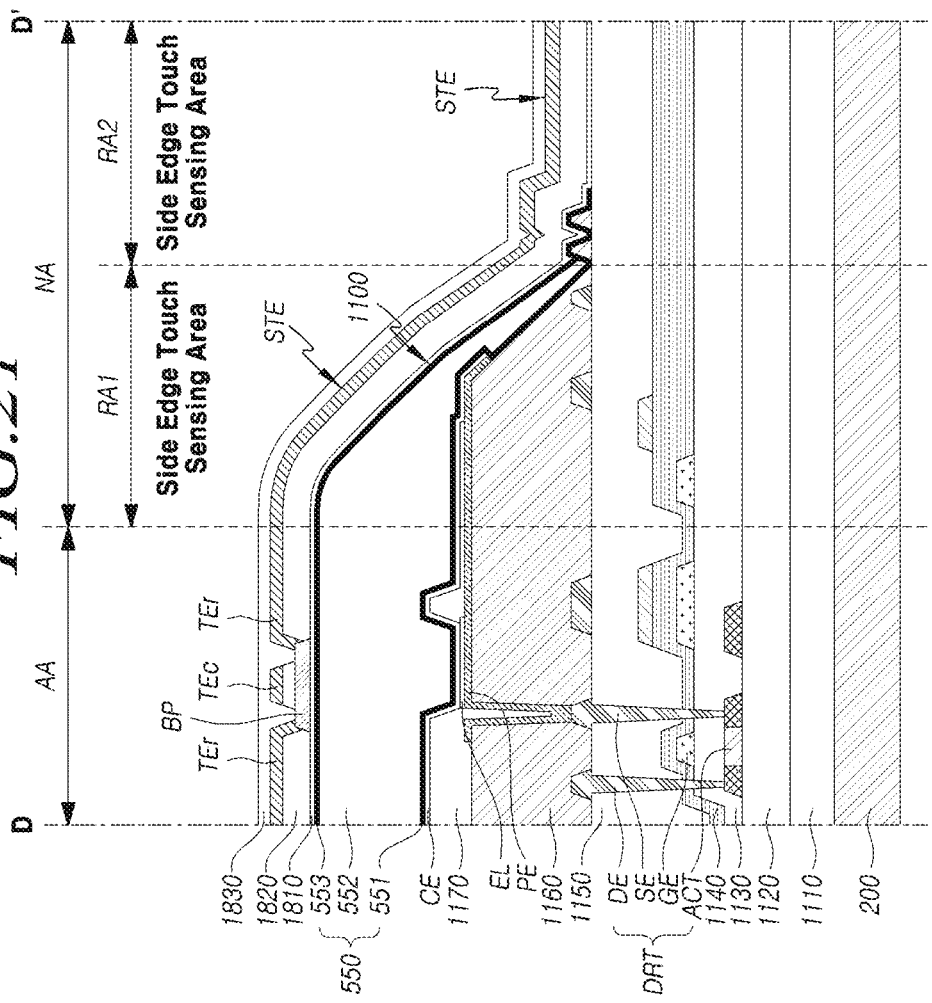
FIGS. 21 and 22 are cross-sectional views along line D-D' in the plan view of FIG. 10.
Figure 22:
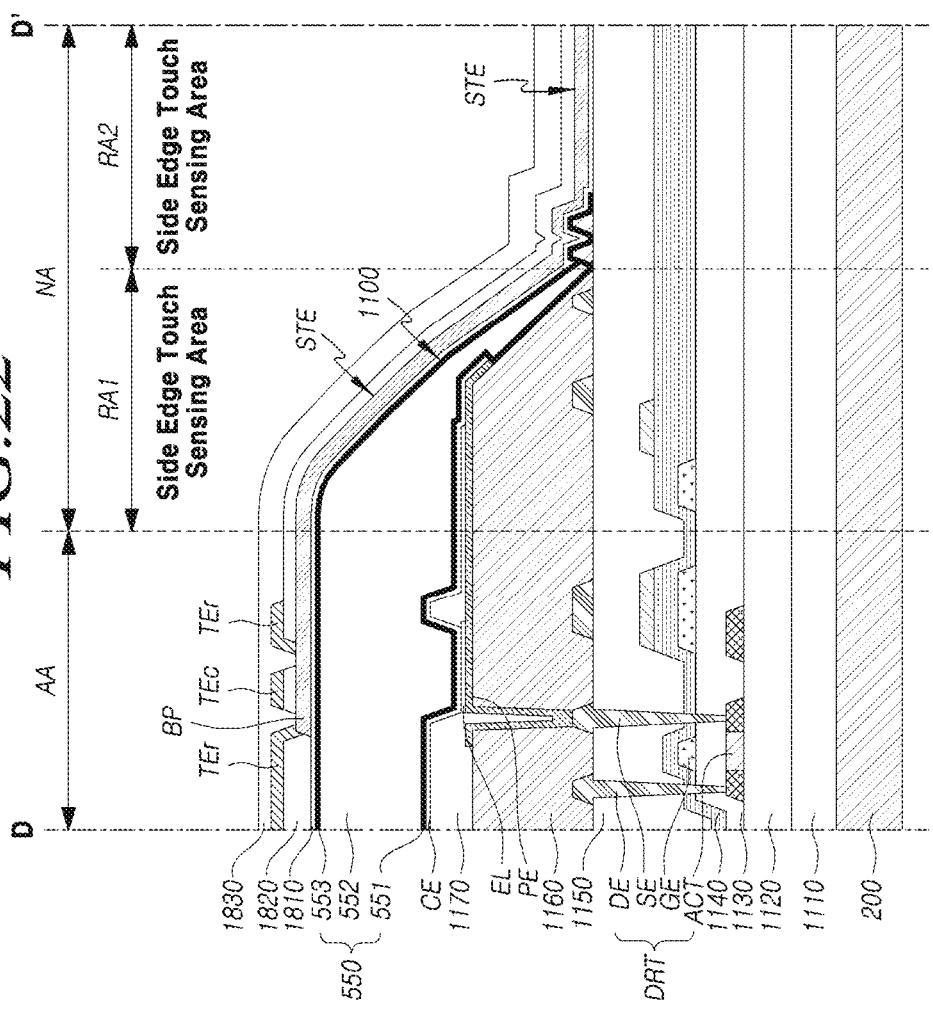

FIG. 19 is a cross-sectional view taken along line B-B' in the plan view of FIG. 8, FIG. 20 is a cross-sectional view along line C-C' in the plan view of FIG. 9, and FIGS. 21 and 22 are cross-sectional views along line D-D' in the plan view of FIG. 10.

First, the touch sensor structure in the active area AA will be described with reference to FIGS. 19 to 22 together with FIG. 3.

Referring to FIGS. 19 to 22 together with FIG. 3, the display device 100 may include the plurality of touch sensors located over the encapsulation layer 550 in the active area AA and the plurality of touch lines TL connecting the plurality of touch sensors to the touch pad portion located in the non-active area NA.

The encapsulation layer 550 may be provided as a single layer or include the first inorganic encapsulation layer 551, the organic encapsulation layer 552, the second organic encapsulation layer 553, and the like.

The touch sensors may include the touch electrodes TEr and TEc and further include bridges BP connecting two adjacent touch electrodes (e.g. TEr).

The touch electrodes TEr and TEc and the bridges BP may be disposed in different layers, with a sensor insulating layer 1820 being sandwiched therebetween.

In addition, a touch buffer layer 1810 located over the encapsulation layer 550 may be further provided. In this case, the touch sensors and the touch lines TL may be located over the touch buffer layer 1810. In some cases, the touch buffer layer 1810 may not be provided, and the touch sensors and the touch lines TL may be disposed directly over the encapsulation layer 550.

The touch lines TL may be connected to or extend from the touch sensors located in the active area AA, extend down along the inclined surface 1100 of the encapsulation layer 550, extend over the one or more dams DAM1 and DAM2, and be connected to the touch pad portion.

Referring to FIGS. 19 to 22, the side edge touch electrodes STE may include the same metals (i.e. touch sensor metals) as the touch sensors. The touch sensor metals may include touch electrode metals included in the touch electrodes TEr and TEc and bridge metals included in the bridges BP. The touch electrode metals may be the same as or different from the bridge metals.

Referring to FIGS. 19 to 21, the side edge touch electrodes STE may include the same touch electrode metals as the touch electrodes TE. Referring to FIG. 22, the side edge touch electrodes STE may include the same bridge metals as the bridges BP.

Referring to FIG. 19 together with FIG. 8, the side edge touch electrodes STE may include the touch electrode metals and be disposed in the second routing area RA2.

Referring to FIG. 20 together with FIG. 9, each of the first touch sensors TEr and BP among the plurality of touch sensors TEr, TEc, and BP includes a touch sensor portion extending to the first routing area RA1 of the non-active area NA. The side edge touch electrodes STE may include the first side edge touch electrode STE located in the first routing area RA1. The first side edge touch electrode STE may intersect the touch sensor portion of the first touch sensor TEr and BP extending to the first routing area RA1.

Referring to FIG. 20 together with FIG. 9, the touch sensor portion (i.e. a portion of the touch electrode TEr) of the first touch sensor TEr and BP extending to the first routing area RA1 is divided into segments by the first side edge touch electrode STE located in the same layer, and the segments of the touch sensor portion are connected by the bridge BP.

In other words, the first side edge touch electrode STE and the touch sensor portion (i.e. the portion of the touch electrode TEr) extending from the first touch sensor TEr to the first routing area RA1 may be located in the same layer.

The touch sensor portion (i.e. the portion of the touch electrode TEr) extending from the first touch sensor TEr to the first routing area RA1 may include a first touch electrode segment more adjacent to the active area AA than the first side edge touch electrode STE and a second touch electrode segment located farther away from the active area AA than the first side edge touch electrode STE. The touch sensor portion may further include the bridge BP connecting the first touch electrode segment (i.e. a first portion of the touch electrode TEr) and the second touch electrode portion (i.e. a second portion of the touch electrode TEr).

Referring to FIG. 20 together with FIG. 9, the first touch sensor TEr and BP among the plurality of touch sensors TEr, TEc, and BP may further include a touch sensor portion extending beyond the first routing area RA1 to the second routing area RA2 of the non-active area NA. The side edge touch electrodes STE may include the second side edge touch electrode STE located in the second routing area RA2. The second side edge touch electrode STE may intersect the portion of the first touch sensor TEr extending to the second routing area RA2.

Referring to FIG. 20 together with FIG. 9, the touch sensor portion (i.e. the portion of the touch electrode TEr) of the first touch sensor TEr and BP extending to the second routing area RA2 is divided into segments by the second side edge touch electrode STE located in the same layer, and the segments of the touch sensor portion are connected by the bridge BP.

The touch sensor portion extending from the first touch sensor TEr to the first routing area RA1 may further extend to the second routing area RA2. In this case, the second side edge touch electrode STE further included in the side edge touch electrodes STE may intersect the touch sensor portion extending to the second routing area RA2.

The soft button(s) realized by the cross-sectional structure illustrated in FIG. 20 and the planar structure illustrated in FIG. 9 may operate using mutual capacitance touch sensing.

The touch sensing circuit may apply a touch driving signal to the touch sensor portion extending to the first routing area RA1 by supplying the touch driving signal having a variable voltage level to the first touch sensor TEr and detect a touch by detecting a change in capacitance in the side edge touch electrode STE through the side edge touch line STL.

Referring to FIGS. 21 and 22 together with FIG. 10, the first touch sensor among the plurality of touch sensors may include a touch sensor portion extending to the first routing area RA1 of the non-active area NA. The touch sensor portion of the first touch sensor extending to the first routing area RA1 may correspond to each of the first side edge touch electrode STE. The touch sensor portion of the first touch sensor extending to the first routing area RA1 may be the touch electrode portion, as illustrated in FIG. 21, or the bridge portion, as illustrated in FIG. 22.

Referring to FIG. 21, the side edge touch electrode STE corresponding to the touch sensor portion of the first touch sensor TEr extending to the first routing area RA1 may include the same touch electrode metal as the touch electrode TE.

Referring to FIG. 22, the side edge touch electrode STE corresponding to the touch sensor portion of the first touch sensor TEr extending to the first routing area RA1 may include the same bridge metal as the bridge BP.

Referring to FIG. 19, in the second routing area RA2, the sensor insulating layer 1820 and the touch buffer layer 1810 may be disposed under the side edge touch electrodes STE. The first insulating layer 1150 may be disposed under the sensor insulating layer 1820 and the touch buffer layer 1810, and the metal layer TM may be disposed under the first insulating layer 1150. The second insulating layer 1140 may be disposed under the metal layer TM, and the gate electrode material layer GML may be disposed under the second insulating layer 1140. One or more of the sensor insulating layer 1820 and the touch buffer layer 1810 may be absence in the second routing area RA2.

Returning to FIG. 19, the side edge touch electrode STE may be electrically connected to the metal layer TM via a triple contact hole in the sensor insulating layer 1820, the touch buffer layer 1810, and the first insulating layer 1150. The metal layer TM may be intended to increase the effective electrode area of the side edge touch electrode STE, thereby increasing capacitance, or be the side edge touch line STL through which signals are transferred to and from the touch driver circuit TDC.

Referring to FIG. 19, the metal layer TM may be electrically connected to the gate electrode material layer GML via a contact hole in the second insulating layer 1140 disposed thereunder. In this case, the gate electrode material layer GML may also be intended to increase the effective electrode area of the side edge touch electrode STE, thereby increasing capacitance, or be the side edge touch line STL through which signals are transferred to and from the touch driver circuit TDC. Alternatively, the side edge touch electrode STE may be in direct contact with the gate electrode material layer GML, instead of being connected to the metal layer TM.

The configuration of the metal layer TM, the gate electrode material layer GML, or both the metal layer TM and the gate electrode material layer GML, illustrated in FIG. 19, may be equally applied to one or more of the cross-sectional structures illustrated in FIGS. 20 to 22. In addition, the other metal lines, such as the source/drain electrode material layer, may be used for the same applications (e.g. increasing the effective electrode area, an application as the side edge touch lines STL, or a combination thereof) as the metal layer TM, the gate electrode material layer GML, or both the metal layer TM and the gate electrode material layer GML.

Figure 23:
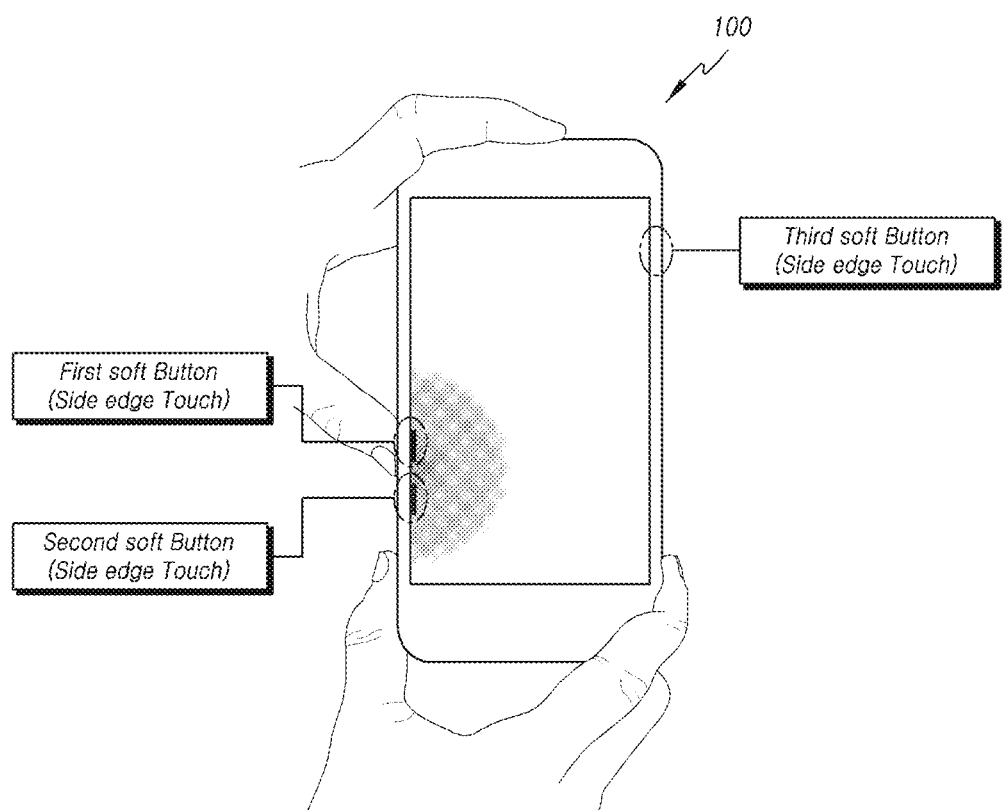
FIG. 23 illustrates examples of first to third soft buttons realized in the side edge touch sensing area of the display device according to embodiments.

FIG. 23 is a view illustrating examples of first to third soft buttons realized in the side edge touch sensing area of the display device 100 according to embodiments.

Referring to FIG. 23, for example, the first and second soft buttons are realized in the side bezel part located to the left of the display device 100, while the third soft button is realized in the side bezel part located to the right of the display device 100.

For example, the first soft button may be intended to increase the volume or to move a user operation position indicator, such as a cursor, in a first direction, while the second soft button may be intended to reduce the volume or move the user operation position indicator, such as the cursor, in a second direction. The third soft button may be intended to lock the screen or turn the display device on or off.

Referring to FIG. 23, in areas in which the first to third soft buttons are realized, the one or more side edge touch electrodes STE may be disposed according to one or more structures among the above-described variety of structures.

A touch sensing circuit or an application processor (AP) may execute a predetermined button process in accordance with the touch sensing result obtained by the one or more side edge touch electrodes STE in the areas in which the first to third soft buttons are realized.

As set forth above, the display device 100 according to embodiments may be provided with no hardware buttons on the bezel part, since the soft button(s) is realized by the one or more side edge touch electrodes STE operating in a touch sensing manner.

Accordingly, all physical hardware buttons for various user inputs may be removed from the display device 100 according to embodiments, thereby reducing the size and the number of components of the display device. In addition, the display device 100 according to embodiments may be liberated from limitations in design caused by physical hardware buttons, thereby being designed in a better and more creative manner.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    a substrate comprising an active area on which images are displayed and a non-active area in which no images are displayed, the non-active area including a first routing area and a second routing area;
    a transistor located over the substrate and in the active area;
    a device insulating layer located over the transistor;
    a pixel electrode located over the device insulating layer and electrically connected to a source electrode or a drain electrode of the transistor via a contact hole in the device insulating layer;
    an emitting layer located over the pixel electrode;
    a common electrode located over the emitting layer;
    an encapsulation layer located over the common electrode, located in the active area and the first routing area, and having an inclined surface in the first routing area;
    one or more dams located at a boundary between the first routing area and the second routing area; and
    a side edge touch electrode located in at least one of the first routing area, the second routing area, or a combination thereof,
    wherein the side edge touch electrode overlaps the inclined surface of the encapsulation layer in the first routing area of the non-active area or is located more outward than the one or more dams in the second routing area of the non-active area.

2. The display device according to claim 1, wherein the side edge touch electrode overlaps the inclined surface of the encapsulation layer in the first routing area of the non-active area.

3. The display device according to claim 2, wherein the side edge touch electrode overlapping the inclined surface of the encapsulation layer comprises a touch sensor material disposed in the active area.

4. The display device according to claim 1, wherein the side edge touch electrode is located more outward than the one or more dams in the second routing area of the non-active area.

5. The display device according to claim 4, wherein the side edge touch electrode located more outward than the one or more dams comprises a display electrode material or a touch sensor material disposed in the active area.

6. The display device according to claim 1, further comprising:
    a first insulating layer located under the side edge touch electrode;
    a metal layer located under the first insulating layer;
    a second insulating layer located under the metal layer; and
    a gate electrode material layer located under the second insulating layer,
    wherein the gate electrode material layer comprises a gate electrode material the same as a gate electrode of the transistor, and
    the side edge touch electrode comprises a source/drain electrode material the same as a source electrode and a drain electrode of the transistor.

7. The display device according to claim 6, wherein the side edge touch electrode is electrically connected to the metal layer via a contact hole in the first insulating layer, and
    the metal layer is a layer increasing an effective electrode area of the side edge touch electrode or a side edge touch line through which a signal is transferred.

8. The display device according to claim 7, wherein the metal layer is electrically connected to the gate electrode material layer via a contact hole in the second insulating layer, and
    the gate electrode material layer is a layer increasing the effective electrode area of the side edge touch electrode or the side edge touch line through which a signal is transferred.

9. The display device according to claim 6, wherein the side edge touch electrode is electrically connected to the gate electrode material layer via a double contact hole in the first insulating layer and the second insulating layer.

10. The display device according to claim 1, further comprising:
    a first insulating layer located under the side edge touch electrode;
    a metal layer located under the first insulating layer;
    a second insulating layer located under the metal layer; and
    a gate electrode material layer located under second insulating layer,
    wherein the gate electrode material layer comprises a gate electrode material the same as a gate electrode of the transistor, and the side edge touch electrode comprises a pixel electrode material the same as the pixel electrode.

11. The display device according to claim 10, wherein a source/drain electrode material layer is located over the first insulating layer in the active area, a pixel electrode material layer providing the side edge touch electrode is located over the first insulating layer in the non-active area,
the side edge touch electrode is electrically connected to the metal layer via a contact hole in the first insulating layer or electrically connected to the gate electrode material layer via a double contact hole in the first insulating layer and the second insulating layer, and
the metal layer or the gate electrode material layer is a layer increasing an effective electrode area of the side edge touch electrode or a side edge touch line through which a signal is transferred.

12. The display device according to claim 11, wherein, in a case in which the side edge touch electrode is electrically connected to the metal layer via the contact hole in the first insulating layer, the metal layer is electrically connected to the gate electrode material layer via a contact hole in the second insulating layer.

13. The display device according to claim 10, further comprising:
a source/drain electrode material layer located over the first insulating layer and comprising a source/drain electrode material the same as a source electrode and a drain electrode of the transistor; and
a peripheral insulating layer located over the source/drain electrode material layer, located under the side edge touch electrode, comprising an insulating material the same as the device insulating layer, and located in the non-active area,
wherein the side edge touch electrode is electrically connected to the source/drain electrode material layer via a contact hole in the peripheral insulating layer, and
the source/drain electrode material layer is a layer increasing an effective electrode area of the side edge touch electrode or a side edge touch line through which a signal is transferred.

14. The display device according to claim 13, wherein the source/drain electrode material layer is electrically connected to the metal layer via a contact hole in the first insulating layer or electrically connected to the gate electrode material layer via a double contact hole in the first insulating layer and the second insulating layer.

15. The display device according to claim 14, wherein, in a case in which the source/drain electrode material layer is electrically connected to the metal layer via the contact hole in the first insulating layer, the metal layer is electrically connected to the gate electrode material layer via a contact hole in the second insulating layer.

16. The display device according to claim 10, wherein the side edge touch electrode is electrically connected to the metal layer via a double contact hole in the peripheral insulating layer and the first insulating layer or electrically connected to the gate electrode material layer via a triple contact hole in the peripheral insulating layer, the first insulating layer, and the second insulating layer, and
the metal layer or the gate electrode material layer is a layer increasing an effective electrode area of the side edge touch electrode or a side edge touch line through which a signal is transferred.

17. The display device according to claim 1, further comprising:
a side edge touch line located in at least one of the first routing area, the second routing area, or a combination thereof, and electrically connected to the side edge touch electrode; and
a touch sensing circuit detecting a touch in accordance with a change in capacitance of the side edge touch electrode through the side edge touch line and executing a predetermined button process in accordance with whether or not the touch is detected.

18. A display device, comprising:
a substrate comprising an active area on which images are displayed and a non-active area in which no images are displayed, the non-active area including a first routing area and a second routing area;
a transistor located over the substrate and in the active area;
a device insulating layer located over the transistor;
a pixel electrode located over the device insulating layer and electrically connected to a source electrode or a drain electrode of the transistor via a contact hole in the device insulating layer;
an emitting layer located over the pixel electrode;
a common electrode located over the emitting layer;
an encapsulation layer located over the common electrode, located in the active area and the first routing area, and having an inclined surface in the first routing area;
one or more dams located at a boundary between the first routing area and the second routing area;
a side edge touch electrode located in at least one of the first routing area, the second routing area, or a combination thereof;
a plurality of touch sensors located over the encapsulation layer in the active area; and
a plurality of touch lines connecting the plurality of touch sensors to a touch pad portion located in the non-active area,
wherein the plurality of touch lines are connected to or extend from the plurality of touch sensors located in the active area, extend down along the inclined surface of the encapsulation layer, extend over the one or more dams, and connected to the touch pad portion,
the side edge touch electrode comprises the same metal as the touch sensor, and
the side edge touch electrode is located to overlap the inclined surface of the encapsulation layer in the non-active area or is located more outward than the one or more dams in the non-active area.

19. The display device according to claim 18, wherein the plurality of touch sensors comprise a plurality of touch electrodes and a plurality of bridges, each of the plurality of bridges connecting two adjacent touch electrodes among the plurality of touch electrodes, wherein the plurality of touch electrodes and the plurality of bridges are disposed in different layers, with a sensor insulating layer being sandwiched therebetween.

20. The display device according to claim 19, wherein the side edge touch electrode comprises a touch electrode metal the same as the plurality of touch electrodes or a bridge metal the same as the plurality of bridges.

21. The display device according to claim 19, wherein the plurality of touch electrodes include a first touch electrode extending to the first routing area of the non-active area, and the side edge touch electrode comprises a first side edge touch electrode intersecting a touch electrode portion of the first touch electrode extending to the first routing area.

22. The display device according to claim 21, further comprising a touch sensing circuit supplying a touch driving signal having a variable voltage level to the touch electrode portion of the first touch electrode extending to the first routing area and detecting a touch in accordance with a change in capacitance of the side edge touch electrode.

23. The display device according to claim 21, wherein the touch electrode portion of the first touch electrode extending to the first routing area and the side edge touch electrode are located in a single layer, and
  the touch electrode portion of the first touch electrode extending to the first routing area comprises:
  a first touch electrode portion more adjacent to the active area than the side edge touch electrode;
  a second touch electrode portion located farther away from the active area than the side edge touch electrode; and
  a bridge, among the plurality of bridges, connecting the first touch electrode portion and the second touch electrode portion.

24. The display device according to claim 21, wherein the touch electrode portion of the first touch electrode extending to the first routing area extends beyond the first routing area to the second routing area, and
  the side edge touch electrode further comprises a second side edge touch electrode intersecting the touch electrode portion of the first touch electrode extending to the second routing area.

25. The display device according to claim 19, wherein the plurality of touch sensors include a first touch sensor extending to the first routing area of the non-active area, a touch sensor portion of the first touch sensor extending to the first routing area corresponds to the side edge touch electrode, the touch sensor portion comprising a touch electrode metal the same as the plurality of touch electrodes or a bridge metal the same as the plurality of bridges.

26. A display device, comprising:
a substrate comprising an active area on which images are displayed and a non-active area in which no images are displayed, the non-active area including a first routing area and a second routing area;
a transistor located over the substrate and in the active area;
a device insulating layer located over the transistor;
a pixel electrode located over the device insulating layer and electrically connected to a source electrode or a drain electrode of the transistor via a contact hole in the device insulating layer;
an emitting layer located over the pixel electrode;
a common electrode located over the emitting layer;
an encapsulation layer located over the common electrode, located in the active area and the first routing area, and having an inclined surface in the first routing area;
one or more dams located at a boundary between the first routing area and the second routing area; and
a side edge touch electrode located in at least one of the first routing area of the non-active area, the second routing area of the non-active area, or a combination thereof,
wherein the substrate is bent, a portion of the substrate corresponding to the active area is directed forward, and a portion of the substrate corresponding to the second routing area of the non-active area is directed to sides.

* * * * *